United States Patent
Choe

(10) Patent No.: US 9,627,581 B2
(45) Date of Patent: Apr. 18, 2017

(54) NITRIDE SEMICONDUCTOR STRUCTURE, ELECTRONIC DEVICE INCLUDING THE NITRIDE SEMICONDUCTOR STRUCTURE, LIGHT-EMITTING DEVICE INCLUDING THE NITRIDE SEMICONDUCTOR STRUCTURE, AND METHOD FOR PRODUCING THE NITRIDE SEMICONDUCTOR STRUCTURE

(71) Applicant: Panasonic Intellectual Property Management Co., Ltd., Osaka (JP)

(72) Inventor: Songbaek Choe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/722,426

(22) Filed: May 27, 2015

(65) Prior Publication Data
US 2015/0357521 A1    Dec. 10, 2015

(30) Foreign Application Priority Data

Jun. 5, 2014    (JP) .................................. 2014-116599

(51) Int. Cl.
*H01L 33/32* (2010.01)
*H01L 33/18* (2010.01)
(Continued)

(52) U.S. Cl.
CPC .......... *H01L 33/32* (2013.01); *H01L 21/0242* (2013.01); *H01L 21/0254* (2013.01);
(Continued)

(58) Field of Classification Search
CPC ... H01L 33/32; H01L 33/007; H01L 33/0075; H01L 33/18
(Continued)

(56) References Cited

U.S. PATENT DOCUMENTS

| | | | | |
|---|---|---|---|---|
| 2002/0014681 A1* | 2/2002 | Tsuda | .................... | H01L 33/007 257/618 |
| 2008/0179623 A1* | 7/2008 | Tachibana | ............... | H01L 33/02 257/103 |

(Continued)

FOREIGN PATENT DOCUMENTS

| | | |
|---|---|---|
| JP | 2008-177586 | 7/2008 |
| JP | 2009-524250 | 6/2009 |

(Continued)

OTHER PUBLICATIONS

Tetsuya Takeuchi et al., "Theoretical Study of Orientation Dependence of Piezoelectric Effects in Wurtzite Strained GaInN/GaN Heterostructures and Quantum Wells" Jpn. J. Appl. Phys. vol. 39(2000), pp. 413-416.

*Primary Examiner* — Asok K Sarkar
*Assistant Examiner* — Dmitriy Yemelyanov
(74) *Attorney, Agent, or Firm* — McDermott Will & Emery LLP

(57) ABSTRACT

A nitride semiconductor structure includes a nitride semiconductor layer having a principal plane and including a nitride semiconductor. The normal to the principal plane of the nitride semiconductor layer is inclined at 5 degrees or more and 17 degrees or less with respect to the [11-22] axis of the nitride semiconductor constituting the nitride semiconductor layer in the direction of the +c-axis of the nitride semiconductor. The nitride semiconductor structure may further include a substrate having a principal plane which supports the nitride semiconductor layer on the principal plane. The substrate may include any one selected from the group consisting of a nitride semiconductor, sapphire, and Si.

15 Claims, 29 Drawing Sheets

(51) Int. Cl.
   *H01L 33/00* (2010.01)
   *H01L 31/103* (2006.01)
   *H01L 33/16* (2010.01)
   *H01L 29/20* (2006.01)
   *H01L 21/02* (2006.01)
   *H01S 5/32* (2006.01)
   *H01S 5/323* (2006.01)

(52) U.S. Cl.
   CPC .... *H01L 21/0262* (2013.01); *H01L 21/02381* (2013.01); *H01L 21/02389* (2013.01); *H01L 21/02433* (2013.01); *H01L 21/02458* (2013.01); *H01L 29/2003* (2013.01); *H01L 31/1035* (2013.01); *H01L 33/007* (2013.01); *H01L 33/16* (2013.01); *H01S 5/3202* (2013.01); *H01S 5/32341* (2013.01)

(58) Field of Classification Search
   USPC .................................................. 257/103, 615
   See application file for complete search history.

(56) References Cited

U.S. PATENT DOCUMENTS

| | | | | |
|---|---|---|---|---|
| 2008/0308815 | A1* | 12/2008 | Kasai | H01L 21/02433 257/76 |
| 2009/0236694 | A1* | 9/2009 | Mizuhara | C30B 29/403 257/615 |
| 2012/0091463 | A1* | 4/2012 | Yokogawa | H01L 21/0237 257/76 |
| 2012/0319156 | A1* | 12/2012 | Yokogawa | B82Y 20/00 257/98 |
| 2014/0077223 | A1* | 3/2014 | Choe | C30B 25/04 257/76 |

FOREIGN PATENT DOCUMENTS

| | | | | |
|---|---|---|---|---|
| JP | WO 2013021606 | A1 * | 2/2013 | ............ C30B 25/04 |
| WO | 2007/084782 | | 7/2007 | |
| WO | 2013/021606 | | 2/2013 | |

* cited by examiner 10.000 μm 10.000 μm

5 μm

NUMBER OF DARK SPOTS: ABOUT 152
DENSITY OF DARK SPOTS: ABOUT $2.7 \times 10^7$ cm$^{-2}$

NITRIDE SEMICONDUCTOR STRUCTURE, ELECTRONIC DEVICE INCLUDING THE NITRIDE SEMICONDUCTOR STRUCTURE, LIGHT-EMITTING DEVICE INCLUDING THE NITRIDE SEMICONDUCTOR STRUCTURE, AND METHOD FOR PRODUCING THE NITRIDE SEMICONDUCTOR STRUCTURE

BACKGROUND

1. Technical Field

The present disclosure relates to a nitride semiconductor structure having a principal plane that is a semi-polar plane, an electronic device including the nitride semiconductor structure, a light-emitting device including the nitride semiconductor structure, and a method for producing the nitride semiconductor structure.

2. Description of the Related Art

Nitride semiconductors have been used as materials of various semiconductor devices such as optical devices (e.g., white light-emitting diode (LED) and semiconductor laser), power devices (e.g., field effect transistor (FET)), and electronic devices.

The stable crystal structure of the nitride semiconductor is a hexagonal wurtzite structure. Therefore, nearly all of practical optoelectronic devices employ a nitride semiconductor structure in which the +c-plane of the hexagonal crystal structure serves as a principal plane.

FIGS. 1A and 1B illustrate the crystal structure of a nitride semiconductor having a wurtzite structure. In FIG. 1B, the notations "$a_1$", "$a_2$", "$a_3$", and "c-axis" denote the orientation of crystallographic axes, and the notations "+c-plane" and "m-plane" denote the orientation of crystallographic planes. The +c-plane (0001) is a crystallographic plane whose normal is the c-axis. The nitride semiconductor does not have inversion symmetry in the c-axis direction. That is, the crystal of the nitride semiconductor has a front side and a back side in the c-axis direction. A high-quality crystal is more likely to be grown in the +c-plane than in other orientations. Accordingly, in general, optoelectronic devices have been produced by stacking a nitride semiconductor structure having a principal plane that is the +c-plane on, for example, a sapphire substrate having a principal plane that is the c-plane in order to produce LEDs, on a silicon (Si) substrate having a principal plane that is the (111) plane in order to produce electronic devices, or a gallium nitride (GaN) bulk substrate having a principal plane that is the +c-plane in order to produce semiconductor lasers.

As described above, relatively high-quality crystals are likely to be grown when the principal plane of the nitride semiconductor is the +c-plane. Therefore, the +c-plane of a nitride semiconductor has been commonly used as a principal plane in order to produce a nitride-semiconductor-based optoelectronic device or to grow a high-quality GaN bulk substrate.

However, it is also known that a nitride semiconductor multilayer structure in which the +c-plane serves as a growth surface has a characteristic due to the asymmetry of the crystal structure of the nitride semiconductor in the c-axis direction. Specifically, polarization occurs in such a nitride semiconductor multilayer structure. The asymmetry of the crystal structure of the nitride semiconductor in the c-axis direction is due to the imbalance in the distribution of cationic gallium (Ga) atoms and anionic nitrogen (N) atoms as illustrated in FIG. 1A. The imbalance in the distribution of these ions causes the polarization to occur in the c-axis direction.

There are two types of polarization: spontaneous polarization and piezoelectronic polarization. In particular, occurrence of piezoelectronic polarization has a strong correlation with the strain generated in the crystal. For example, in an indium gallium nitride (InGaN) well layer stacked on a GaN layer, the higher the indium (In) content in the InGaN well layer, the larger the amount of strain that occurs in the crystal and the greater the degree of polarization that occurs in the InGaN well layer. The polarization causes an internal electric field to occur in the c-axis direction in the InGaN quantum well constituting an active layer. When the internal electric field (i.e., mainly piezoelectric field) occurs in the active layer, a position gap between the distribution of electrons and the distribution of the holes in the active layer may be created due to the quantum confined Stark effect of carriers, which reduces internal quantum efficiency. This leads to an increase in the threshold current of a semiconductor laser, an increase in the power consumption of an LED, and a reduction in the luminous efficiency of an LED. In addition, screening of the piezoelectric field may occur with an increase in the density of the injected carriers, which causes emission wavelength to vary.

As described above, crystal growth on the principal plane that is the +c-plane facilitates formation of a high-quality crystal structure, but may also cause adverse effects due to spontaneous polarization and piezoelectric polarization. Hereinafter, the c-plane, which is a plane such that polarization occurs when crystal grown is performed on the plane, is referred to as "polar plane".

In order to address the above-described issues, there have been proposed a nitride semiconductor crystal structure having a principal plane other than the +c-plane and a method for growing such a nitride semiconductor crystal structure. For example, growing a nitride semiconductor in the a-axis direction or the m-axis direction as illustrated in FIG. 1B prevents the above-described polarization from occurring.

When crystal growth is performed in the a-axis or m-axis direction, that is, when the a-plane or the m-plane serves as a principal plane, polarization does not occur in the direction of the normal to the plane because, in these planes, Ga atoms and N atoms lie in the same atomic plane. Thus, if a semiconductor multilayer structure is formed using, for example, the m-plane as a principal plane, a piezoelectric field would not be formed. For example, LEDs having such a non-polar plane as a principal plane have a higher luminous efficiency than LEDs of the related art which have a principal plane that is the c-plane. Hereinafter, a crystallographic plane in which polarization does not occur is referred to as "non-polar plane", and the term "m-plane" collectively refers to the (1-100) plane, the (−1010) plane, the (10-10) plane, the (−1100) plane, the (01-10) plane, and the (0-110) plane. As described above, polarization occurs in a nitride semiconductor crystal structure having a principal plane that is the polar c-plane, but not in a nitride semiconductor crystal structure having a principal plane that is the non-polar a-plane or m-plane.

It is described in Japanese Journal of Applied Physics Vol. 39 (2000), pp. 413-416 that, even when the principal plane of the nitride semiconductor crystal structure is not the non-polar a-plane nor m-plane, the degree of polarization becomes small compared with the case where the principal plane of a nitride semiconductor crystal structure is the polar c-plane. It is described in Japanese Journal of Applied Physics Vol. 39 (2000), pp. 413-416 that, when an $In_{0.1}Ga_{0.9}N/GaN$ multilayer structure having a thickness of 3 nm is formed on a principal plane that is the (11-24) plane or the (10-12) plane, the degree of polarization can be reduced to a level comparable to that to which the degree of polarization can be reduced when the nitride semiconductor crystal structure has a principal plane that is a non-polar plane. The (11-24) plane refers to a plane whose normal is inclined at 39 degrees with respect to the c-axis in the a-axis direction, and the (10-12) plane refers to a plane whose normal is inclined at 43 degrees with respect to the c-axis in the m-axis direction. Hereinafter, planes inclined with respect to the polar c-plane and the non-polar a-plane or m-plane are collectively referred to as "semi-polar plane".

As described above, it is known that a nitride semiconductor crystal structure having a principal plane that is a non-polar plane or a semi-polar plane is capable of reducing the degree of polarization, which occurs in a nitride semiconductor crystal structure having a principal plane that is the polar c-plane.

However, in general, it is difficult to perform crystal growth for forming the nitride semiconductor structure having a principal plane that is a non-polar plane or a semi-polar plane compared with a structure of the related art having a principal plane that is the polar +c-plane. Thus, it is difficult to reduce the amount of crystallographic defects in order to obtain high-quality crystals.

Japanese Patent Application No. 2008-551465 discloses a method in which a nitride semiconductor thin-film having a principal plane that is a semi-polar plane is formed on an intentionally miscut substrate (i.e., inclined substrate). It is described that the density of crystallographic defects can be reduced by growing a nitride semiconductor structure having a principal plane that is a semi-polar plane on a substrate intentionally inclined with respect to a low-index crystallographic orientation while controlling the direction and angle of the inclination of the substrate appropriately, and thereby crystallinity can be improved. According to Japanese Patent Application No. 2008-551465, the inclination angle is desirably 0.5 degrees to 20 degrees and is more desirably 0.5 degrees or more and 3.0 degrees or less. The results of forming a nitride semiconductor having a principal plane that is the semi-polar (11-22) plane on an m-plane sapphire substrate having a principal plane that is the (1-100) plane are described in Examples of Japanese Patent Application No. 2008-551465. In this study, the direction and angle of the inclination of the m-plane sapphire substrate were changed within the range of −0.5 to 1.0 degrees with respect to the m-axis in the c-axis direction. It is described that increasing the inclination angle improves crystallinity, which is evaluated in accordance with the half width measured by X-ray diffraction in the (11-22) plane of the nitride semiconductor, and that setting the inclination angle to 1.0 degrees improves crystallinity best. However, a case where the inclination angle exceeds 1 degree is not described in Examples of Japanese Patent Application No. 2008-551465.

SUMMARY

A nitride semiconductor structure that has a non-polar plane or a semi-polar plane and a high crystal quality has been anticipated in the related art.

In one general aspect, the techniques disclosed here feature a nitride semiconductor structure including a nitride semiconductor layer having a principal plane and including a nitride semiconductor, a normal to the principal plane of the nitride semiconductor layer being inclined at 5 degrees or more and 17 degrees or less with respect to a [11-22] axis of the nitride semiconductor constituting the nitride semiconductor layer in the direction of a +c-axis of the nitride semiconductor.

One non-limiting and exemplary embodiment provides a nitride semiconductor structure that promotes bending of dislocations, which are crystallographic defects, that occur during crystal growth and thereby reduces the number of dislocations that reach the growth surface by setting, when crystal growth is performed in order to form a nitride semiconductor multilayer structure having a semi-polar principal plane, the normal to the principal plane of the nitride semiconductor multilayer structure to be inclined at 5 degrees or more and 17 degrees or less with respect to the [11-22] axis of the nitride semiconductor in the direction of the +c-axis of the nitride semiconductor. This enables a high-quality semi-polar plane nitride semiconductor multilayer structure including a nitride semiconductor layer having a dislocation density of, for example, $1 \times 10^8$ cm$^{-2}$ or less to be formed.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
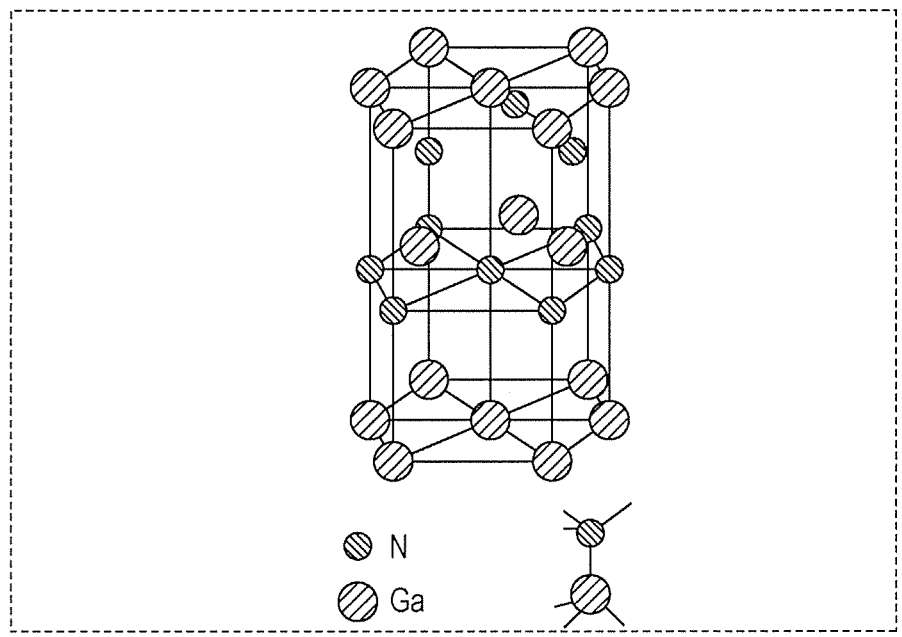
FIG. 1A is a schematic perspective view of the unit lattice of GaN.
Figure 1B:
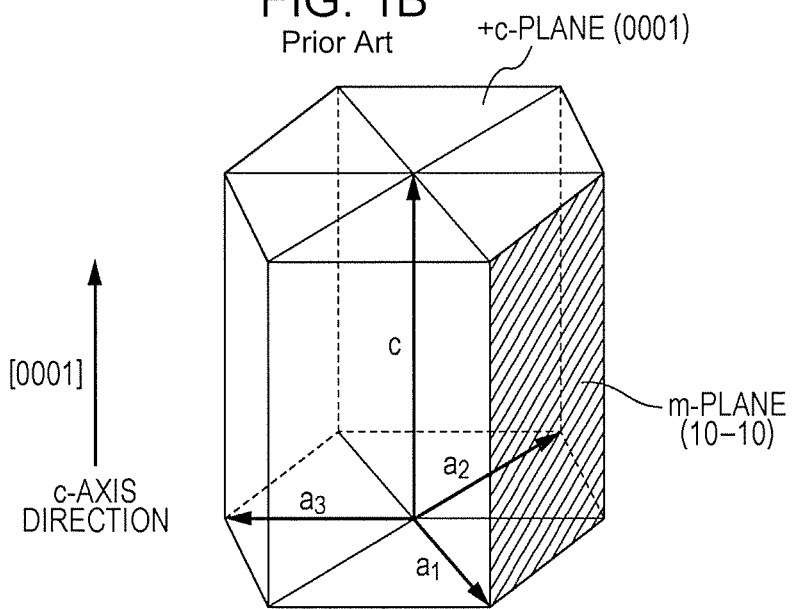
FIG. 1B is a perspective view of a wurtzite crystal structure, illustrating fundamental vectors $a_1$, $a_2$, $a_3$, and c.

The inventor of the present disclosure has conducted detailed studies of a method for improving the crystal quality of a nitride semiconductor structure having a semi-polar plane serving as a principal plane and, as a result, has found that inclining the principal plane at a certain angle with respect to a specific crystallographic axis may limit the occurrence of dislocation in the nitride semiconductor structure having a semi-polar plane serving as a principal plane, which enables a nitride semiconductor structure having a higher crystal quality than those of the related art to be formed.

A dislocation is a defect present within a nitride semiconductor crystal and is a type of line defects. Dislocations can be classified into edge dislocations, screw dislocations, mixed dislocations, and the like, depending on the direction of the Burgers vector. Stacking faults also occur in a nitride semiconductor crystal. A stacking fault is a type of planar defects and is most likely to be formed on the c-plane. Although, in general, dislocations can be bent, stacking faults do not bend since they are planar defects. Thus, even if stacking faults occur in the nitride semiconductor structure of the related art, which has a polar +c-plane serving as a principal plane, the planar defects would not spread in the growth direction since they principally extend in a direction perpendicular to the growth direction. Therefore, stacking faults would negligibly affect the crystal quality of the entire nitride semiconductor structure during formation of the nitride semiconductor structure having a polar plane serving as a principal plane.

On the other hand, stacking faults may spread in the growth direction when a nitride semiconductor is grown with a non-polar plane or a semi-polar plane serving as a principal plane, since the c-plane is perpendicular or inclined at a certain angle with respect to the principal growth plane. The presence of stacking faults may affect the crystal quality of the entire nitride semiconductor structure, which may consequently affect the properties of a device prepared using the nitride semiconductor structure. As described above, dislocations (i.e., line defects) and stacking faults (i.e., planar defects) are different from each other.

The dislocation density in a nitride semiconductor multilayer structure having a non-polar plane or a semi-polar plane serving as a principal plane is higher than that in the nitride semiconductor multilayer structure of the related art, in which the +c-plane serves as a principal plane. In addition, such a nitride semiconductor multilayer structure is susceptible to the above-described stacking faults. Therefore, it is important to reduce the numbers of the dislocations and the stacking faults in order to form a nitride semiconductor multilayer structure having a non-polar plane or a semi-polar plane serving as a principal plane. The nitride semiconductor structure according to an embodiment of the present disclosure primarily enables, for the two types of defects, a reduction in dislocation density to be achieved by controlling the inclination angle of the principal plane.

The outlines of the nitride semiconductor structure, electronic device, light-emitting device, and a method for producing the nitride semiconductor structure according to embodiments of the present disclosure are described below.

A nitride semiconductor structure according to a first embodiment of the present disclosure includes a nitride semiconductor layer having a principal plane and including a nitride semiconductor. The normal to the principal plane of the nitride semiconductor layer is inclined at 5 degrees or more and 17 degrees or less with respect to the [11-22] axis of the nitride semiconductor constituting the nitride semiconductor layer in the direction of the +c-axis of the nitride semiconductor. This enables a nitride semiconductor structure having a semi-polar plane serving as a principal plane in which the number of crystallographic defects is reduced to be produced.

The above-described nitride semiconductor structure may further include a substrate having a principal plane which supports the nitride semiconductor layer on the principal plane. The substrate may include any one selected from the group consisting of a nitride semiconductor, sapphire, and Si.

The substrate may be a sapphire substrate including the sapphire. The normal to the principal plane of the substrate is inclined at 5 degrees or more and 17 degrees or less with respect to the m-axis of the sapphire in the direction of the c-axis of the sapphire.

The above-described nitride semiconductor structure may further include a buffer layer located between the nitride semiconductor layer and the substrate. The buffer layer includes a nitride semiconductor that does not include aluminum.

The substrate may include a nitride semiconductor. The normal to the principal plane of the substrate is inclined at 5 degrees or more and 17 degrees or less with respect to the [11-22] axis of the nitride semiconductor in the direction of the +c-axis of the nitride semiconductor.

The substrate may include silicon. The normal to the principal plane of the substrate is inclined at 41 degrees or more and 53 degrees or less with respect to the (111) plane of the silicon in the direction of the [1-10] axis of the silicon.

The dislocation density in the nitride semiconductor layer may be $1 \times 10^8$ cm$^{-2}$ or less as measured by TEM.

The normal to the principal plane of the nitride semiconductor layer may be inclined at 10 degrees or more and 17 degrees or less with respect to the normal to the (11-22) plane of the nitride semiconductor constituting the nitride semiconductor layer in the direction of the +c-axis of the nitride semiconductor.

The normal to the principal plane of the nitride semiconductor layer may be inclined at 5 degrees or more and 15 degrees or less with respect to the [11-22] axis of the nitride semiconductor constituting the nitride semiconductor layer in the direction of the +c-axis of the nitride semiconductor.

When the substrate is a sapphire substrate including the sapphire, the normal to the principal plane of the substrate may be inclined at 5 degrees or more and 15 degrees or less with respect to the m-axis of the sapphire in the direction of the c-axis of the sapphire.

When the substrate includes a nitride semiconductor, the normal to the principal plane of the substrate may be inclined at 5 degrees or more and 15 degrees or less with respect to the [11-22] axis of the nitride semiconductor in the direction of the +c-axis of the nitride semiconductor.

When the substrate includes silicon, the normal to the principal plane of the substrate may be inclined at 43 degrees or more and 53 degrees or less with respect to the (111) plane of the silicon in the direction of the [1-10] axis of the silicon.

The normal to the principal plane of the nitride semiconductor layer may be inclined at 10 degrees or more and 15 degrees or less with respect to the normal to the (11-22) plane of the nitride semiconductor constituting the nitride semiconductor layer in the direction of the +c-axis of the nitride semiconductor.

An electronic device according to a second embodiment of the present disclosure includes the above-described nitride semiconductor structure.

A light-emitting device according to a third embodiment of the present disclosure includes:

the above-described nitride semiconductor structure;

a nitride semiconductor multilayer structure disposed on the nitride semiconductor structure, the nitride semiconductor multilayer structure including an n-type nitride semiconductor layer, a p-type nitride semiconductor layer, and an active layer located between the n-type nitride semiconductor layer and the p-type nitride semiconductor layer;

an n-side electrode being in electrical contact with the n-type nitride semiconductor layer; and a p-side electrode being in electrical contact with the p-type nitride semiconductor layer.

A method for producing the above-described nitride semiconductor structure includes epitaxially growing a nitride semiconductor layer on a substrate having a principal plane. The substrate is any one selected from the group consisting of a nitride semiconductor substrate including a nitride semiconductor in which the normal to the principal plane is inclined at 5 degrees or more and 17 degrees or less with respect to the [11-22] axis of the nitride semiconductor constituting the nitride semiconductor substrate in the direction of the +c-axis of the nitride semiconductor, a sapphire substrate including sapphire in which the normal to the principal plane is inclined at 5 degrees or more and 17 degrees or less with respect to the m-axis of the sapphire in the direction of the c-axis of the sapphire, and a Si substrate including silicon in which the normal to the principal plane is inclined at 41 degrees or more and 53 degrees or less with respect to the (111) plane of the Si in the direction of the [1-10] axis of the Si.

A growth surface of the nitride semiconductor layer while the nitride semiconductor layer is being epitaxially grown may include a {10-11} facet plane.

In the above-described method for producing the above-described nitride semiconductor structure, the substrate may be any one selected from the group consisting of a nitride semiconductor substrate including a nitride semiconductor in which the normal to the principal plane is inclined at 5 degrees or more and 15 degrees or less with respect to the [11-22] axis of the nitride semiconductor constituting the nitride semiconductor substrate in the direction of the +c-axis of the nitride semiconductor, a sapphire substrate including sapphire in which the normal to the principal plane is inclined at 5 degrees or more and 15 degrees or less with respect to the m-axis of the sapphire in the direction of the c-axis of the sapphire, and a Si substrate including Si in which the normal to the principal plane is inclined at 43 degrees or more and 53 degrees or less with respect to the (111) plane of the Si in the direction of the [1-10] axis of the Si.

First Embodiment

Figure 2:
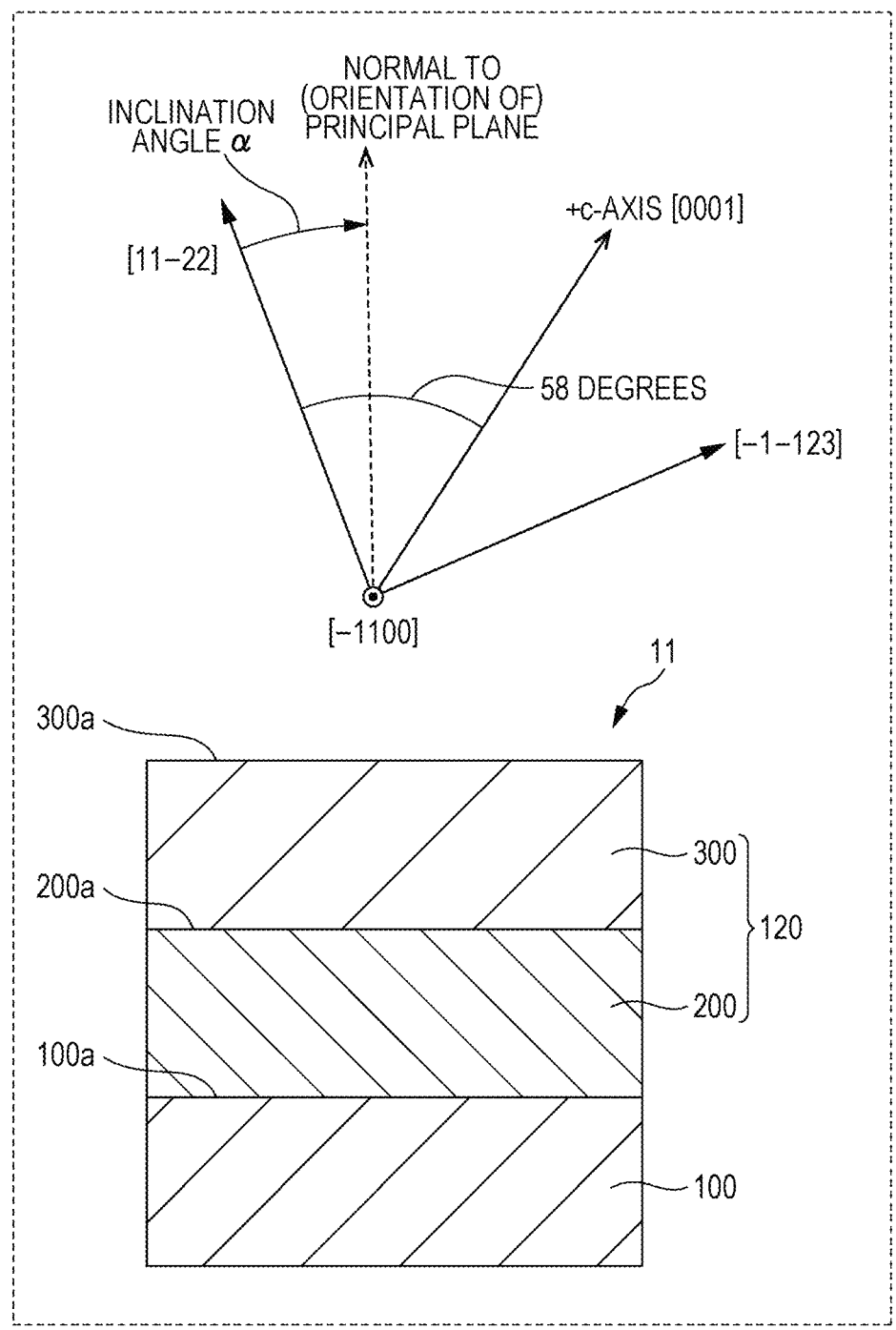
FIG. 2 is a schematic cross-sectional view of a nitride semiconductor multilayer structure according to an embodiment of the present disclosure.

A nitride semiconductor structure according to the first embodiment of the present disclosure is described below with reference to the attached drawings. FIG. 2 is a cross-sectional view of the nitride semiconductor structure according to the first embodiment. As illustrated in FIG. 2, the nitride semiconductor structure 11 according to the first embodiment includes a substrate 100 and a nitride semiconductor multilayer structure 120. In the first embodiment, the nitride semiconductor multilayer structure 120 includes a buffer layer 200 and a nitride semiconductor layer 300 including a nitride semiconductor. It is essential that the nitride semiconductor multilayer structure 120 include the nitride semiconductor layer 300, and the buffer layer 200 can be omitted. The nitride semiconductor multilayer structure 120 is an epitaxial semiconductor multilayer structure formed by utilizing the crystallinity of the principal plane of the substrate 100. The term "nitride semiconductor" used herein refers to a semiconductor having a composition $Al_xIn_yGa_zN$ (where $0 \leq x < 1$, $0 \leq y < 1$, $0 \leq z < 1$, and $x+y+z=1$). The nitride semiconductor may include boron (B). The above-described components of the nitride semiconductor structure according to the first embodiment are described in detail below.

Substrate 100

The substrate 100 supports the nitride semiconductor multilayer structure 120 and provides a crystal plane on which the nitride semiconductor layer 300 included in the nitride semiconductor multilayer structure 120 can be epitaxially grown with a desired semi-polar plane serving as a principal plane. The substrate 100 is a single-crystal nitride semiconductor or the like. The substrate 100 has a principal plane 100a. The normal to (i.e., orientation of) the principal plane 100a is inclined at 5 degrees or more and 17 degrees or less and is desirably inclined at 5 degrees or more and 15 degrees or less with respect to the [11-22] axis of the nitride semiconductor in the direction of the +c-axis of the nitride semiconductor.

Alternatively, the substrate 100 may be composed of single-crystal sapphire. In such a case, the principal plane 100a may be inclined with respect to the m-plane of the sapphire crystal constituting the substrate 100. The m-plane refers to the (1-100) plane or a plane equivalent to the (1-100) plane, that is, the (-1100) plane, the (01-10) plane, the (0-110) plane, the (10-10) plane, or the (-1010) plane. The normal to the principal plane 100a is inclined at 5 degrees or more and 17 degrees or less and is desirably inclined at 5 degrees or more and 15 degrees or less with respect to the m-axis of the sapphire crystal in the direction of the c-axis of the sapphire crystal. Note that, hereinafter, the bar attached to a number of a miller index is represented by a minus sign "−" attached in front of the number. For example, "(−1100)" refers to "(one-bar, one, zero, zero)".

The substrate 100 composed of single-crystal sapphire may have a c-plane that is inclined at 41 degrees or more and 53 degrees or less and is desirably inclined at 43 degrees or more and 53 degrees or less with respect to the principal plane 100a in the m-axis direction. In such a case, striped protrusion-recess structure may be formed in the principal plane 100a by dry etching or the like so that the c-plane of the sapphire crystal, which is inclined with respect to the principal plane 100a, is exposed at the side surfaces of the protrusion-recess structure.

The substrate 100 may be composed of single-crystal Si. A nitride semiconductor having a c-plane serving as a principal plane can be grown on the (111) plane of Si. Thus, the substrate 100 may be composed of Si, and the normal to the principal plane is inclined at 41 degrees or more and 53 degrees or less and is desirably inclined at 43 degrees or more and 53 degrees or less with respect to the (111) plane of Si in the direction of the [1-10] axis of Si. In such a case, striped protrusion-recess structure may also be formed in the principal plane 100a by dry etching or the like so that the (111) plane of Si, which is inclined with respect to the principal plane 100a, is exposed at the side surfaces of the protrusion-recess structure.

Using the above-described substrate 100 allows a nitride semiconductor multilayer structure 120 in which the normal to the principal plane 300a of the nitride semiconductor layer 300 is inclined at an angle α of 5 degrees or more and 17 degrees or less and is desirably inclined at an angle α of 5 degrees or more and 15 degrees or less with respect to the [11-22] axis of the nitride semiconductor constituting the nitride semiconductor layer 300 in the direction of the +c-axis of the nitride semiconductor, which is described in detail below, to be formed. The nitride semiconductor layer 300 has a high crystal quality, in which occurrence of defects is limited. When the substrate 100 is composed of single-crystal sapphire, a protrusion-recess structure may be formed in the principal plane 100a. Forming a protrusion-recess structure in the principal plane 100a further enhances the crystal quality of the nitride semiconductor layer 300. The results obtained in Example 10 below show that it was possible to improve crystallinity by performing selective growth using a mask formed on the surface of a sapphire substrate. Note that, as described above, the inclination angle α refers to an angle at which the orientation (normal direction) of the principal plane 300a is inclined with respect to the [11-22] axis of the nitride semiconductor in the +c-axis direction.

Buffer Layer 200

The buffer layer 200 is composed of a nitride semiconductor. The buffer layer 200 is formed on the substrate 100 so as to cover the principal plane 100a of the substrate 100. The buffer layer 200 includes a principal plane 200a. The crystallinity of the principal plane 200a is reflective of that of the principal plane 100a of the substrate 100, which enables a nitride semiconductor layer 300 to be epitaxially grown on the principal plane 200a. The buffer layer 200 is formed on the substrate 100 by epitaxial growth.

As illustrated in FIG. 2, the normal to the principal plane 200a of the buffer layer 200 is inclined at 5 degrees or more and 17 degrees or less and is desirably inclined at 5 degrees or more and 15 degrees or less with respect to the [11-22] axis of the nitride semiconductor in the direction of the +c-axis of the nitride semiconductor. The buffer layer 200 may be grown under conditions different from those under which the nitride semiconductor layer 300 is grown. The buffer layer 200 may include boron (B). For example, the buffer layer 200 may be composed of aluminum nitride (AlN) and may have a thickness of 10 nm or more and 300 nm or less. The growth temperature may be 500° C. or more and 700° C. or less. Alternatively, the buffer layer 200 may be composed of a nitride semiconductor that does not include aluminum. In this case, for example, the buffer layer 200 may be composed of GaN and may be grown at a lower pressure (e.g., 100 Torr) than the nitride semiconductor layer 300. As described above, the buffer layer 200 may be omitted.

Nitride Semiconductor Layer 300

The nitride semiconductor layer 300 covers the principal plane 200a of the buffer layer 200 disposed on the substrate 100. The nitride semiconductor layer 300 is supported by the substrate 100 with the buffer layer 200 located therebetween. In the case where the buffer layer 200 is not provided, the nitride semiconductor layer 300 is disposed directly on the principal plane 100a of the substrate 100. The nitride semiconductor layer 300 is composed of a nitride semiconductor. The nitride semiconductor layer 300 may include p-type or n-type impurities. The nitride semiconductor layer 300 is an epitaxial layer.

As illustrated in FIG. 2, the normal to (i.e., orientation of) the principal plane 300a of the nitride semiconductor layer 300 is inclined at 5 degrees or more and 17 degrees or less and is desirably inclined at 5 degrees or more and 15 degrees or less with respect to the [11-22] axis of the nitride semiconductor constituting the nitride semiconductor layer 300 in the direction of the +c-axis of the nitride semiconductor, similarly to the buffer layer 200. By controlling the normal to the principal plane 300a of the nitride semiconductor layer 300, that is, the growth direction of the nitride semiconductor layer 300, to be within the above-described range of the inclination angle, it is possible to bend dislocations during crystal growth and thereby reduce the number of the dislocations, which are crystallographic defects. Such a range of the inclination angle is, when measured with respect to the +c-axis of the nitride semiconductor, 41 degrees or more and 53 degrees or less and is desirably 43 degrees or more and 53 degrees or less with respect to the +c-axis in the [11-22] axis direction. That is, the range of 5 degrees or more and 17 degrees or less with respect to the [11-22] axis of the nitride semiconductor is equivalent to the range of 41 degrees or more and 53 degrees or less with respect to the +c-axis of the nitride semiconductor, and the range of 5 degrees or more and 15 degrees or less with respect to the [11-22] axis of the nitride semiconductor is equivalent to the range of 43 degrees or more and 53 degrees or less with respect to the +c-axis of the nitride semiconductor. Hereinafter, an inclination angle is measured with respect to the [11-22] axis consistently. That is, the expressions "inclined at 5 degrees or more and 17 degrees or less in the +c-axis direction" and "inclined at 5 degrees or more and 15 degrees or less in the +c-axis direction" are employed consistently.

The [11-22] axis and the +c-axis intersect at 58 degrees in a plane containing the [11-22] axis and the +c-axis. In this plane, the [11-22] axis intersects the [−1-123] axis at right angles, and the [11-22] axis and the [−1-123] axis intersect the [−1100] axis (i.e., m-axis) at right angles.

It is desirable that the normal to the principal plane 300a of the nitride semiconductor layer 300 is not inclined in the [−1100] axis (i.e., m-axis) direction. This is because dislocation density can be reduced in the most effective manner by controlling the inclination angle of the principal plane 300a when the normal to the principal plane 300a lies in the plane containing the [11-22] axis and c-axis of the nitride semiconductor layer. However, it is possible to substantially achieve the reduction in dislocation density when the inclination angle of the normal to the principal plane 300a with respect to the plane containing the [11-22] axis and the +c-axis is small. Specifically, in a plane that is perpendicular to the plane containing the [11-22] axis and the +c-axis and that contains the m-axis, the normal to the principal plane 300a may be inclined at ±5 degrees or less and is desirably inclined at ±1 degree or less with respect to the [11-22] axis.

The expression "bending of dislocations" used herein refers to a change in the direction in which the dislocations spread. Dislocations are bent inside the crystal during the growth of the nitride semiconductor layer 300, which makes the dislocations less likely to spread until they reach the growth surface. This reduces the dislocation density in the vicinity of the surface of the nitride semiconductor layer 300, which improves crystallinity. When a bent dislocation is brought into contact with another dislocation, the two dislocations may be combined with each other, which reduces the number of the dislocations.

Bending of dislocations occurs depending on the inclination angle of the normal to the principal plane 300a of the nitride semiconductor layer 300. Specifically, bending of dislocations is promoted when the normal to the principal plane 300a is inclined at 1 degree or more with respect to the [11-22] axis of the nitride semiconductor in the +c-axis direction. As described in detail below, when the inclination angle α is 1 degree, the bending angle of the dislocations becomes about 10 degrees. Note that the term "bending angle" used herein refers to an inclination angle of dislocation lines, which is measured with respect to the direction of the normal to the principal plane 200a. If the inclination angle α is about 1 degree, it is difficult to improve the crystallinity in the vicinity of the growth surface of the nitride semiconductor layer 300 to a sufficient degree by using bending of dislocations. On the other hand, when the inclination angle α is 5 degrees or more and 17 degrees or less and is desirably 5 degrees or more and 15 degrees or less, the bending angle of dislocations becomes 30 degrees or more. Since dislocations are bent at a relatively large angle, the dislocation density in the vicinity of the growth surface is markedly reduced, which improves crystallinity. When the inclination angle α is 5 degrees or more and 17 degrees or less and is desirably 5 degrees or more and 15 degrees or less, the dislocation density in the nitride semiconductor layer according to the first embodiment is $1\times10^8$ cm$^{-2}$ or less.

A specific example method for measuring dislocation density is described below. A thin piece of a nitride semiconductor layer having a thickness of about 0.1 μm in a direction perpendicular to the cross section is cut in order to observe a cross section of the nitride semiconductor layer by TEM. Subsequently, a TEM image of a cross section of the nitride semiconductor layer which is perpendicular to the nitride semiconductor layer is formed. Assuming a base line that is parallel to the sapphire substrate and that has a predetermined length in the TEM image of the nitride semiconductor layer, the number of dislocation lines that intersect the base line is counted. Dislocation density can be calculated by dividing the number of the dislocation lines by the area of the region measured (i.e., the predetermined length×the thickness (about 0.1 μm) of the nitride semiconductor layer in a direction perpendicular to the cross section). The base line is located at a height of 3 μm or less from the principal plane in the growth direction of the nitride semiconductor layer. The predetermined length of the base line is 10 μm or more.

Dislocation density can also be measured using cathodoluminescence that occurs in the principal growth plane of the nitride semiconductor layer. In cathodoluminescence imaging, points at which threading dislocations are present can be detected as nonluminescent region. That is, threading dislocations present on the surface of the nitride semiconductor layer can be observed as dark spots by cathodoluminescence imaging. Thus, alternatively, dislocation density can also be calculated by dividing the number of the dark spots present within a region (10 μm$^2$ or more) of the cathodoluminescence image by the area of the region.

In the case where the nitride semiconductor structure 11 according to the first embodiment includes the buffer layer 200 composed of a nitride semiconductor, it is also possible to reduce dislocation density in the buffer layer 200 due to the same mechanism as that described above.

Mechanism for Bending Dislocations

As described above, in the first embodiment, bending of dislocation occurs since the normal to the principal plane of the nitride semiconductor to be grown is inclined at 1 degree or more with respect to the [11-22] axis of the nitride semiconductor in the direction of the +c-axis of the nitride semiconductor. Directions in which dislocations bent include m-axis direction components in the principal plane. The mechanism for bending dislocations in the first embodiment is described with reference to the FIG. 3.

Figure 3:
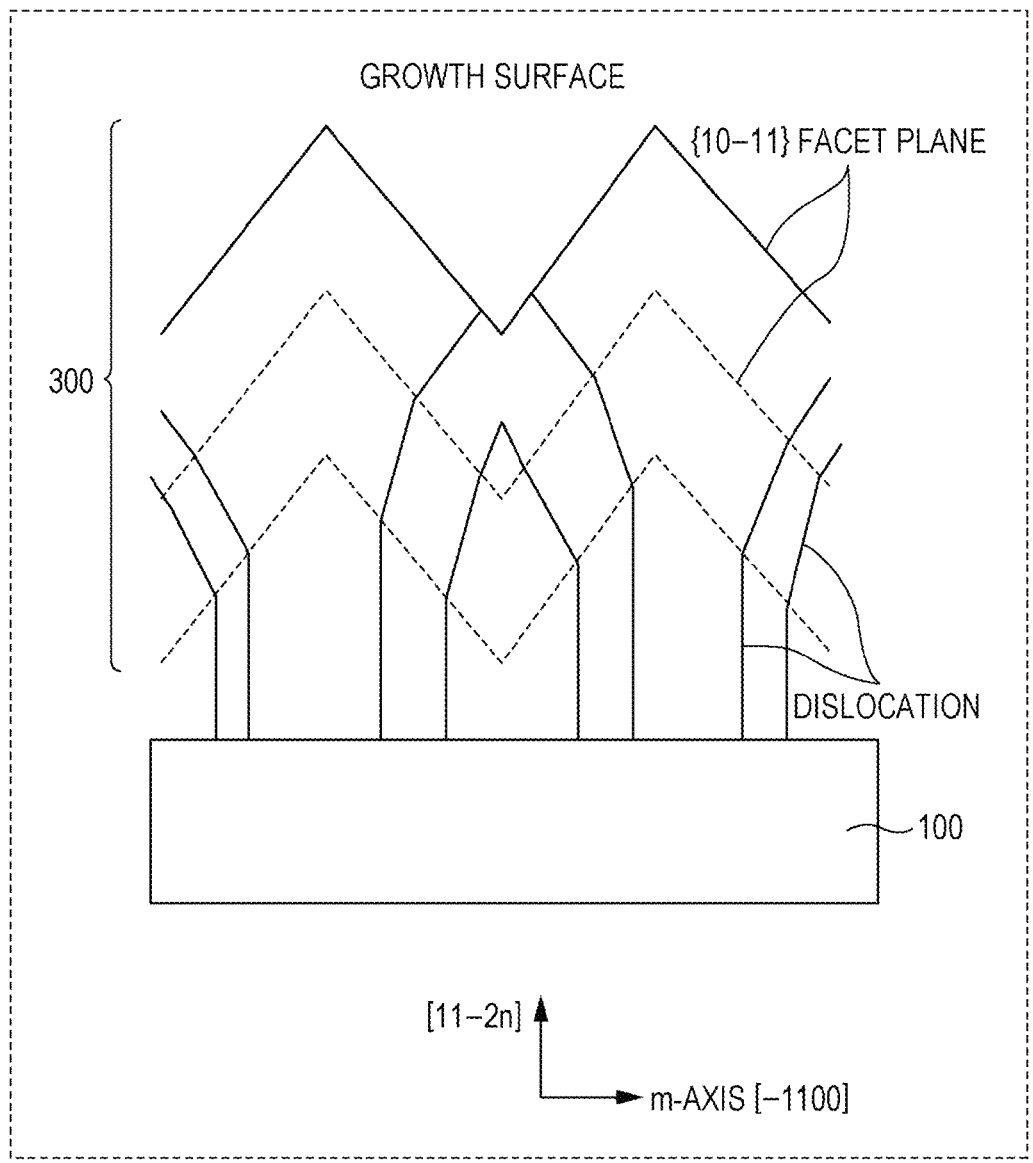
FIG. 3 schematically illustrates a mechanism for bending dislocations according to an embodiment of the present disclosure.

In the first embodiment, bending of dislocations can be observed in a direction perpendicular to the m-axis in the principal plane of a nitride semiconductor structure having a semi-polar plane serving as a principal plane. For example, when the crystallographic orientation of the nitride semiconductor layer 300 formed on the substrate 100 is as illustrated in FIG. 3, bending of dislocations is likely to be observed in a direction perpendicular to the drawing. Thus, bending of dislocations can be confirmed by observing a cross section of the nitride semiconductor layer 300 in such a direction by, for example, transmission electron microscopy.

In contrast, it is difficult to observe bending of dislocations by cross-sectional transmission electron microscopy in a direction perpendicular to the direction illustrated in FIG. 3, that is, in the m-axis direction illustrated in FIG. 3.

This is presumably because dislocations inside the semi-polar plane nitride semiconductor structure lie mainly in the c-plane and bending of dislocations occurs in the c-plane.

As described above, in the case where the inclination angle of the principal plane of the semi-polar plane nitride semiconductor is 0 degrees, the bending angle of the dislocations viewed in a direction perpendicular to the m-axis becomes substantially 0 degrees. In the case where the inclination angle is 1 degree, the bending angle of the dislocations becomes about 10 degrees. In the case where the inclination angle is 5 degrees or more, the bending angle of the dislocations becomes 30 degrees or more.

Inclining the orientation of the semi-polar principal plane at a desired angle promotes bending of dislocations, which reduces the risk of the dislocations reaching the growth surface. This reduces dislocation density in the vicinity of the growth surface and improves the quality of a semi-polar plane nitride semiconductor structure, although it has been considered to be difficult to perform crystal growth of a semi-polar plane nitride semiconductor structure compared with a +c-plane nitride semiconductor structure. It is considered that formation of facets during growth as illustrated in FIG. 3 also plays an important role in bending of dislocations described above. Specifically, a facet plane that primarily promotes bending of dislocations is considered to be the {10-11} plane. The {10-11} facet plane is a plane equivalent to the m-plane inclined with respect to the m-axis in the c-axis direction.

The term "{10-11} facet plane" used herein collectively refers to the (10-11) plane, the (01-11) plane, the (1-100) plane, the (-1100) plane, the (-1010) plane, and the (0-110) plane.

Figure 4A:
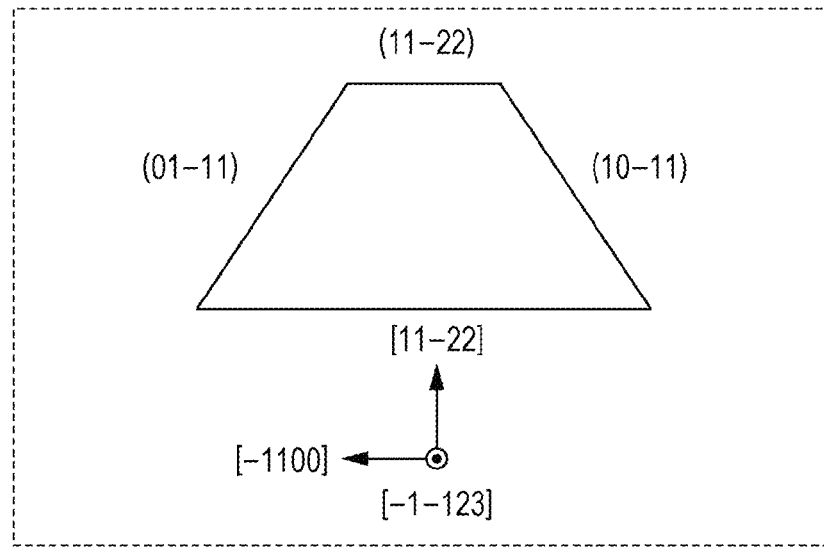
FIGS. 4A and 4B illustrate the relationship between the orientation of the principal plane of a nitride semiconductor layer having the (11-22) principal plane and the {10-11} facet planes.
Figure 4B:
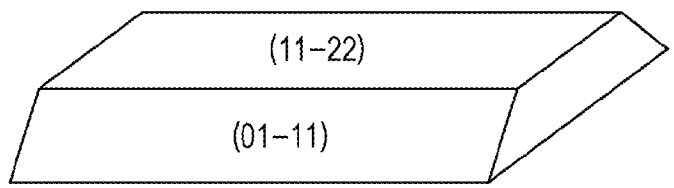
Figure 4C:
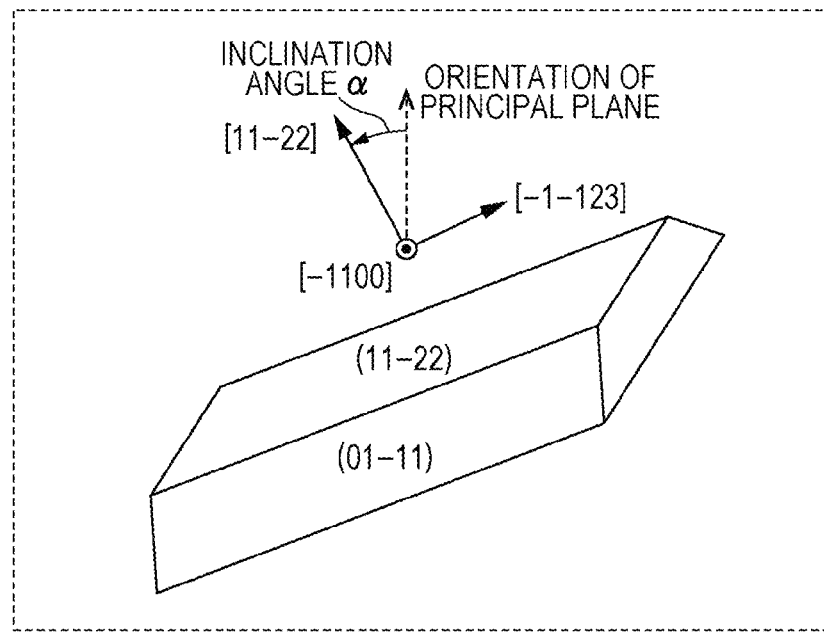
FIG. 4C illustrates the relationship between the orientation of the principal plane of a nitride semiconductor layer inclined at an angle α according to an embodiment of the present disclosure and the {10-11} facet planes.

FIGS. 4A, 4B, and 4C illustrate the positional relationship between the (11-22) plane and the {10-11} planes in the GaN semiconductor layer. In the case where the principal plane of the nitride semiconductor layer is the (11-22) plane, that is, in the case where the inclination angle α of the principal plane is 0 degrees, the (10-11) plane and its equivalent plane, that is, the (01-11) plane, are located symmetrically with respect to a plane that is perpendicular to the [-1100] axis and that contains the [11-22] axis.

It is described in Japanese Patent No. 4743214 that dislocation density can be reduced by bending dislocations using the {10-11} facet plane, which is formed by growing a +c-plane nitride semiconductor using a mask.

According to the studies conducted by the inventor of the present disclosure, it is considered that the {10-11} facet plane can also be formed during the growth of a semi-polar plane nitride semiconductor, in which the orientation of the principal plane is inclined at a desired angle, which promotes bending of dislocations and thereby reduces dislocation density.

While the mechanism is not clarified, in the case where the principal plane of the nitride semiconductor layer is the (11-22) plane as illustrated in FIG. 4A, the {10-11} facet planes are formed in the nitride semiconductor layer, but bending of dislocations at the {10-11} planes is hardly observed. The same applies when the inclination angle α is 0 degrees or more and 1 degree or less.

On the other hand, in the case where the normal to (i.e., orientation of) the principal plane of the nitride semiconductor layer is inclined at an angle of more than 1 degree with respect to the normal to the (11-22) plane (i.e., [11-22] axis) of the nitride semiconductor as illustrated in FIG. 4C, dislocations are bent less than 10 degrees at the {10-11} planes. In the case where the inclination angle α is 5 degrees or more and 17 degrees or less and is desirably 5 degrees or more and 15 degrees or less, dislocations are bent 30 degrees or more. This reduces the number of dislocations that reach the principal plane to a sufficient degree. Furthermore, two or more dislocations may be combined with one another, which reduces dislocation density.

However, if the inclination angle α is 20 degrees or more, the crystallinity of the semi-polar plane nitride semiconductor may be significantly degraded. This is presumably because an excessively large inclination angle makes it difficult to form the {10-11} facet planes. In addition, the angle at which dislocations are bent at the {10-11} facet planes becomes less than 10 degrees.

In the first embodiment, as described above, the orientation of the principal plane of the semi-polar plane nitride semiconductor structure is inclined at a desired angle in order to facilitate the formation of the {10-11} facet planes. This promotes bending of dislocations, which leads to a reduction in dislocation density in the vicinity of the growth surface. As illustrated in FIG. 3, dislocations are bent at the facet planes and accumulate at recesses (valley portions illustrated in FIG. 3) formed by the facets. In this manner, combination of two or more dislocations is promoted.

In order to promote bending of dislocations, it is desirable to form a nitride semiconductor layer having a semi-polar plane serving as a principal plane under growth conditions under which the {10-11} facet planes can be formed. In such a case, the {10-11} facet planes are present on the surface of the nitride semiconductor layer after growth, and dislocations are terminated at the recesses formed by the facets. This enables a growth surface having a low dislocation density to be formed.

The morphology of the growth surface can be controlled by changing the growth conditions. Specifically, a flat growth surface having no facet can be formed by changing the growth conditions after the above-described {10-11} facet planes are grown. That is, it is essential in the first embodiment that the step of crystal growth in which the {10-11} facet planes are formed in order to promote bending of dislocations be included in the process for forming the nitride semiconductor layer 300.

Even in the case where the nitride semiconductor structure 11 according to the first embodiment includes the buffer layer 200 composed of a nitride semiconductor, it is considered that bending of dislocations can also be achieved in the buffer layer 200 by the same mechanism and thereby dislocation density may be reduced.

The larger the thicknesses of the nitride semiconductor layer 300 and the buffer layer 200, the greater the reduction in dislocation density due to bending of dislocations. The total thickness of the buffer layer 200 and the nitride semiconductor layer 300 is desirably, for example, 500 nm or more. If the total thickness of the buffer layer 200 and the nitride semiconductor layer 300 is less than 500 nm, dislocations may reach the growth surface of the nitride semiconductor layer 300 before the dislocations are bent, which limits the reduction in dislocation density. The total thickness of the buffer layer 200 and the nitride semiconductor layer 300 is, for example, 500 nm or more and 3 mm or less.

A desirable total thickness of the buffer layer 200 and the nitride semiconductor layer 300 varies depending on the desired dislocation density in the nitride semiconductor structure 11 and the materials of the substrate 100, the nitride semiconductor layer 300, and the buffer layer 200. For example, when the substrate 100 is a sapphire substrate having an inclined m-plane, the lattice constant of the sapphire is different from the lattice constant of the nitride semiconductor. In such a case, defects and dislocations may occur in the buffer layer 200 at a high density due to the difference in the materials of the substrate 100 and the buffer layer 200. Even if the substrate 100 is a nitride semiconductor substrate, which is composed of the same crystal as that constituting the buffer layer 200, defects and dislocations would occur in the buffer layer 200 at a high density depending on the surface treatment and surface conditions of the substrate 100. In such cases, the thicknesses of the buffer layer 200 and the nitride semiconductor layer 300 may be set depending on dislocation density in the buffer layer 200 measured during growth.

The nitride semiconductor structure according to the first embodiment can be used as a base structure for producing nitride semiconductor optical devices (e.g., LEDs, light-receiving devices, and solar cells), nitride semiconductor lasers, and nitride semiconductor electronic devices (e.g., transistors and power devices). The nitride semiconductor structure according to the first embodiment may also be used as a base structure for producing nitride semiconductor bulk crystals. In such a case, the substrate 100 of the nitride semiconductor structure may be omitted.

Production Method

The nitride semiconductor multilayer structure according to the first embodiment can be produced by a common method in which the nitride semiconductor layer 300 is epitaxially grown on the substrate 100 in such a manner that the orientation of the principal plane 300a is inclined at 5 degrees or more and 17 degrees or less and is desirably inclined at 5 degrees or more and 15 degrees or less with respect to the [11-22] axis of the nitride semiconductor in the direction of the +c-axis of the nitride semiconductor. Thus, the substrate 100 may be selected appropriately so that a nitride semiconductor structure that enables the above-described inclination of the plane orientation to be controlled is formed thereon. Specifically, the above-described substrate 100 can be used.

The nitride semiconductor multilayer structure 120 including the nitride semiconductor layer 300 and the buffer layer 200 can be formed by, for example, metal organic chemical vapor deposition (hereinafter, abbreviated as "MOCVD"), molecular beam epitaxy, or hydride vapor phase epitaxy. Alternatively, liquid phase epitaxy for thick nitride semiconductors, which is employed for growing bulk substrates or the like, such as an ammonothermal method or a Na-flux method, may also be employed. Examples of growth methods particularly desirable for reducing dislocation density in the first embodiment include hydride vapor phase epitaxy and liquid phase epitaxy for bulk substrates, which enable a layer having a thickness of a few millimeters to be grown.

EXAMPLES

Nitride semiconductor structures according to the first embodiment were prepared. The results of measurement of the properties of the nitride semiconductor structures are described below. The nitride semiconductor used in Examples below was GaN.

1. Preparation of Samples

Reference Example 1

Inclination Angle α=0 Degrees

Figure 5A:
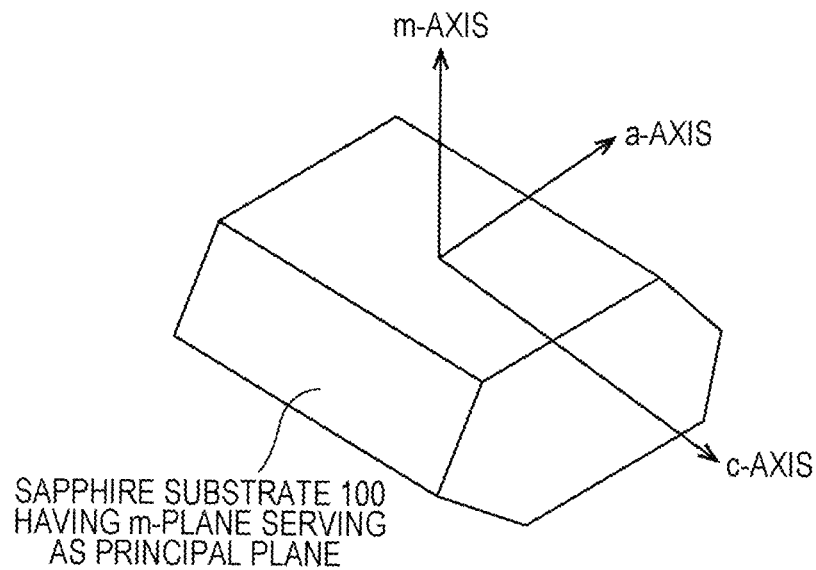
FIG. 5A schematically illustrates the crystallographic orientation of a sapphire substrate used in Reference Example 1.

A sapphire substrate 100 having an m-plane serving as a principal plane was prepared. The m-plane sapphire substrate 100 was a product of KYOCERA Corporation. FIG. 5A schematically illustrates the m-plane sapphire substrate used in Reference Example 1.

The inclination angle α of the m-plane sapphire substrate used in Reference Example 1 was 0 degrees. The inclination angle α refers to an angle at which the sapphire substrate was inclined with respect to the m-axis (i.e., orientation of the m-plane) of the sapphire substrate in the c-axis direction illustrated in FIG. 5A. In this case, the a-axis serves as a rotation axis. The sapphire substrate 100 had a diameter of about 2 inches and a thickness of 0.43 mm.

Washing of Sapphire Substrate

The sapphire substrate 100 was washed with a cleaning liquid heated at 100° C. for 10 minutes. The cleaning liquid was a mixture of sulfuric acid and phosphoric acid with a volume ratio of 1:1. The sapphire substrate 100 was then washed with water.

The step of washing the sapphire substrate was not an essential step. Even when the washing step was omitted, it was possible to form a nitride semiconductor multilayer structure having a semi-polar plane serving as a principal plane, and the properties of the nitride semiconductor multilayer structure, such as crystallinity, did not vary greatly.

Growth of Buffer Layer 200 and Nitride Semiconductor Layer 300

Figure 5B:
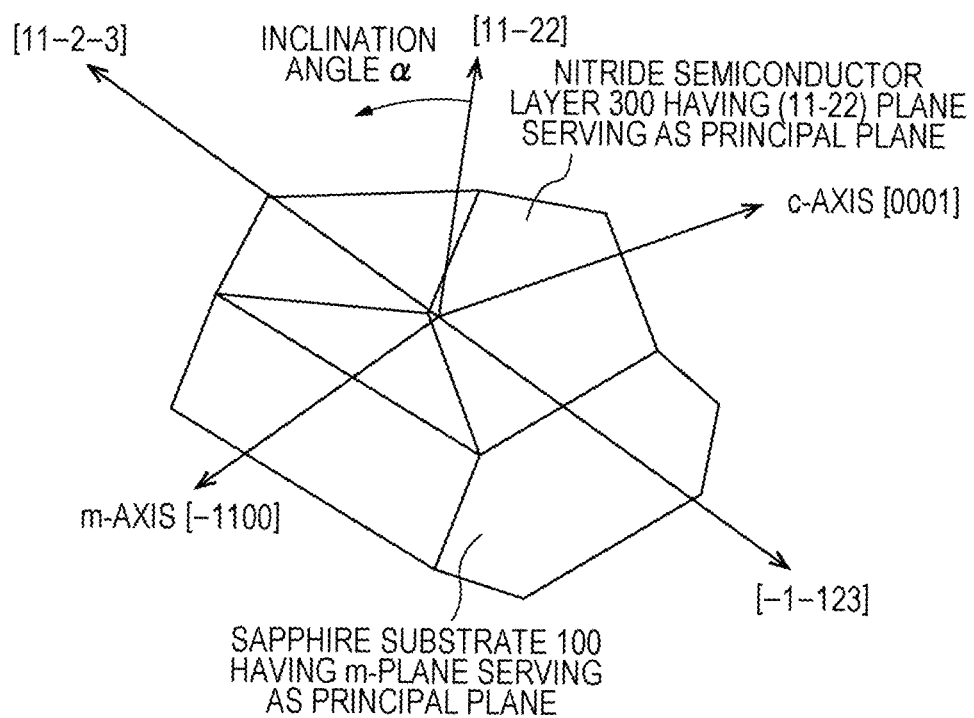
FIG. 5B illustrates the relationship between a sapphire substrate and the crystallographic orientation of a nitride semiconductor layer in Reference Example 1.

When a nitride semiconductor was epitaxially grown on the m-plane sapphire substrate 100, the initial step of the crystal growth process was controlled so that the (11-22) plane of the nitride semiconductor became a principal plane. FIG. 5B illustrates the relationship between the m-plane sapphire and the crystallographic orientation of (11-22) plane GaN. The m-axis of sapphire was parallel to the [11-22] axis of GaN. The a-axis of sapphire was parallel to the m-axis of GaN. The c-axis of sapphire was parallel to the [−1-123] axis of GaN. The [11-22] axis of GaN was inclined at 58 degrees with respect to the c-axis of GaN. In other words, the inclination angle α was set to 0 degrees in Reference Example 1.

Growth of GaN Layer

The sapphire substrate 100 was placed in an MOCVD system. Hydrogen and nitrogen were used as carrier gas in the MOCVD system.

The sapphire substrate 100 was heated in the MOCVD system. When the temperature of the sapphire substrate 100 reached 500° C., ammonia gas was supplied into the MOCVD system. The ammonia gas presumably caused the surface of the sapphire substrate 100 to be nitrided.

In Examples, the sapphire substrate 100 was not subjected to a high-temperature heat treatment at 900° C. in an atmosphere that did not include ammonia (i.e., a hydrogen-nitrogen mixed gas atmosphere or an atmosphere including either hydrogen or nitrogen) before the nitride semiconductor layer was grown on the substrate. Commonly, the surface of the sapphire substrate may be cleaned through a heat treatment in a growth furnace before a nitride semiconductor layer is grown thereon. However, in Examples, it was impossible to form a desired nitride semiconductor layer 300 on a sapphire substrate that had been subjected to a heat treatment particularly in the case where the inclination angle α was large. Specifically, in the case where the sapphire substrate inclined at an angle α of 10 degrees or more and 20 degrees or less was subjected to a heat treatment, it was impossible to form a semi-polar plane nitride semiconductor having the [11-22] axis inclined at 10 to 20 degrees in the +c-axis direction on the inclined sapphire substrate. Therefore, in Examples, the sapphire substrate was not subjected to a high-temperature heat treatment at 900° C. or more in an atmosphere that did not include ammonia regardless of the inclination angle.

One minute after the temperature of the sapphire substrate 100 reached 950° C., trimethylgallium (hereinafter, abbreviated as "TMG") and ammonia were supplied into the MOCVD system. Thus, a nitride semiconductor layer 300 having the (11-22) plane serving as a principal plane was grown on the surface of the m-plane sapphire substrate 100. A nitride semiconductor multilayer structure composed of GaN was formed in the above-described manner.

While the nitride semiconductor layer 300 was formed on the surface of the sapphire substrate 100, the sapphire substrate 100 was rotated at a speed of 3 rpm. Table 1 summarizes the conditions for growing the nitride semiconductor layer 300.

TABLE 1

| Flow rate of TMG | 136 μmol/min |
|---|---|
| Flow rate of ammonia | 3 L/min |
| Growth rate of nitride semiconductor layer 300 | About 5 μm/hr |
| Growth time of nitride semiconductor layer 300 | 1 hr |
| Growth pressure | 66 kPa |
| Ammonia/TMG charge ratio (molar ratio) | About 985 |

In Reference Example 1, a buffer layer 200 was omitted. A buffer layer 200 may be formed between the substrate and the nitride semiconductor layer by a common method when the nitride semiconductor layer is formed on the substrate.

Reference Example 2

Inclination Angle α=0.5 Degrees

Figure 6A:
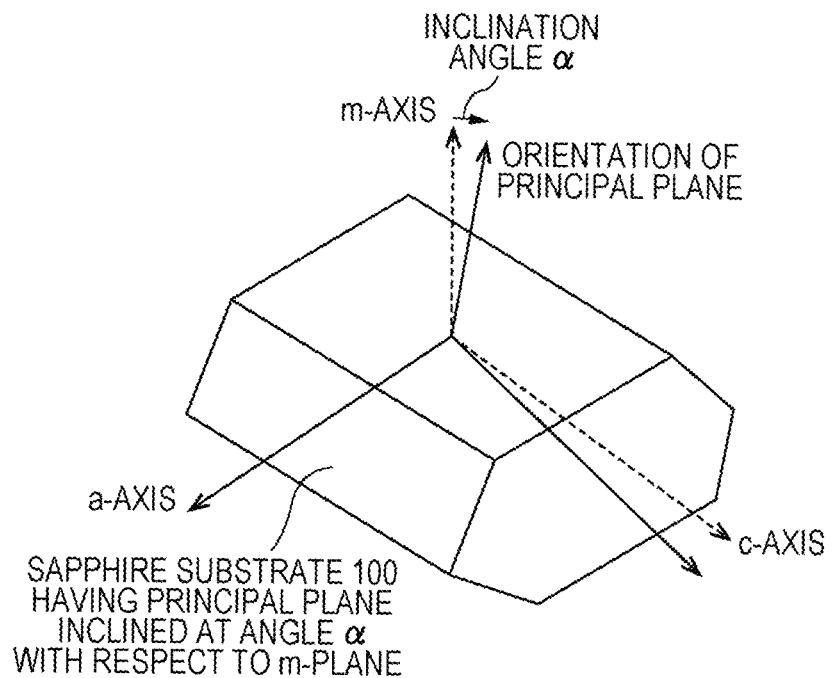
FIG. 6A illustrates the crystallographic orientation of a sapphire substrate inclined at an angle α which was used in Reference Examples 2 and 3 and Examples 4 to 8.

A nitride semiconductor multilayer structure was prepared as in Reference Example 1, except that the substrate 100 used was a sapphire substrate having a principal growth plane inclined at an angle α (illustrated in FIG. 6A) of 0.5 degrees. The sapphire substrate 100 used was a product of KYOCERA Corporation. As illustrated in FIG. 6A, the inclination angle α refers to an angle at which the sapphire substrate was inclined with respect to the m-axis (i.e., orientation of the m-plane) of the sapphire substrate in the c-axis direction. In this case, the a-axis serves as a rotation axis.

Figure 6B:
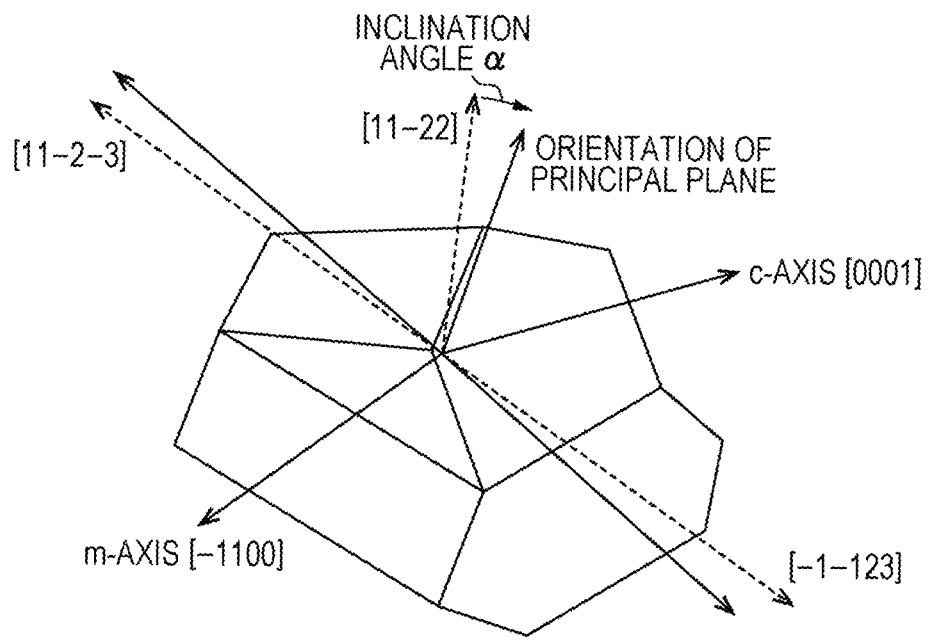
FIG. 6B illustrates the crystallographic orientation of a nitride semiconductor layer inclined at an angle α, which was grown on a sapphire substrate, prepared in Reference Examples 2 and 3 and Examples 4 to 8.

A semi-polar plane nitride semiconductor was grown on the sapphire substrate 100 as in Reference Example 1. The orientation of the principal plane of the semi-polar plane nitride semiconductor was such that the inclination angle α illustrated in FIG. 6B was about 0.5 degrees with respect to the [11-22] axis of GaN in the +c-axis direction.

Reference Example 3

Inclination Angle α=1.0 Degrees

A nitride semiconductor multilayer structure was prepared as in Reference Example 1, except that the substrate 100 used was a sapphire substrate having a principal growth plane inclined at an angle α (illustrated in FIG. 6A) of 1.0 degrees. The sapphire substrate 100 used was a product of KYOCERA Corporation. As illustrated in FIG. 6A, the inclination angle α refers to an angle at which the sapphire substrate was inclined with respect to the m-axis (i.e., orientation of the m-plane) of the sapphire substrate in the c-axis direction. In this case, the a-axis serves as a rotation axis.

A semi-polar plane nitride semiconductor was grown on the sapphire substrate 100 as in Reference Example 1. The orientation of the principal plane of the semi-polar plane nitride semiconductor was such that the inclination angle α illustrated in FIG. 6B was about 1.0 degrees with respect to the [11-22] axis of GaN in the +c-axis direction.

Example 4

Inclination Angle α=5 Degrees

A nitride semiconductor multilayer structure was prepared as in Reference Example 1, except that the substrate 100 used was a sapphire substrate having a principal growth plane inclined at an angle α (illustrated in FIG. 6A) of 5 degrees. The sapphire substrate 100 used was a product of KYOCERA Corporation. As illustrated in FIG. 6A, the inclination angle α refers to an angle at which the sapphire substrate was inclined with respect to the m-axis (i.e., orientation of the m-plane) of the sapphire substrate in the c-axis direction. In this case, the a-axis serves as a rotation axis.

A semi-polar plane nitride semiconductor was grown on the sapphire substrate 100 as in Reference Example 1. The orientation of the principal plane of the semi-polar plane nitride semiconductor was such that the inclination angle α illustrated in FIG. 6B was about 5 degrees with respect to the [11-22] axis of GaN in the +c-axis direction.

Example 5

Inclination Angle α=10 Degrees

A nitride semiconductor multilayer structure was prepared as in Reference Example 1, except that the substrate 100 used was a sapphire substrate having a principal growth plane inclined at an angle α (illustrated in FIG. 6A) of 10 degrees. The sapphire substrate 100 used was a product of KYOCERA Corporation. As illustrated in FIG. 6A, the inclination angle α refers to an angle at which the sapphire substrate was inclined with respect to the m-axis (i.e., orientation of the m-plane) of the sapphire substrate in the c-axis direction. In this case, the a-axis serves as a rotation axis.

A semi-polar plane nitride semiconductor was grown on the sapphire substrate 100 as in Reference Example 1. The orientation of the principal plane of the semi-polar plane nitride semiconductor was such that the inclination angle α illustrated in FIG. 6B was about 10 degrees with respect to the [11-22] axis of GaN in the +c-axis direction. In other words, the principal plane of the nitride semiconductor layer 300 prepared in Example 5 was the (11-23) plane.

Example 6

Inclination Angle α=15 Degrees

A nitride semiconductor multilayer structure was prepared as in Reference Example 1, except that the substrate 100 used was a sapphire substrate having a principal growth plane inclined at an angle α (illustrated in FIG. 6A) of 15 degrees. The sapphire substrate 100 used was a product of KYOCERA Corporation. As illustrated in FIG. 6A, the inclination angle α refers to an angle at which the sapphire substrate was inclined with respect to the m-axis (i.e., orientation of the m-plane) of the sapphire substrate in the c-axis direction. In this case, the a-axis serves as a rotation axis.

A semi-polar plane nitride semiconductor was grown on the sapphire substrate 100 as in Reference Example 1. The orientation of the principal plane of the semi-polar plane nitride semiconductor was such that the inclination angle α illustrated in FIG. 6B was about 15 degrees with respect to the [11-22] axis of GaN in the +c-axis direction.

Example 7

Inclination Angle α=17 Degrees

A nitride semiconductor multilayer structure was prepared as in Reference Example 1, except that the substrate 100 used was a sapphire substrate having a principal growth plane inclined at an angle α (illustrated in FIG. 6A) of 17 degrees. The sapphire substrate 100 used was a product of KYOCERA Corporation. As illustrated in FIG. 6A, the inclination angle α refers to an angle at which the sapphire substrate was inclined with respect to the m-axis (i.e., orientation of the m-plane) of the sapphire substrate in the c-axis direction. In this case, the a-axis serves as a rotation axis.

A semi-polar plane nitride semiconductor was grown on the sapphire substrate 100 as in Reference Example 1. The orientation of the principal plane of the semi-polar plane nitride semiconductor was such that the inclination angle α illustrated in FIG. 6B was about 17 degrees with respect to the [11-22] axis of GaN in the +c-axis direction.

Example 8

Inclination Angle α=20 Degrees

A nitride semiconductor multilayer structure was prepared as in Reference Example 1, except that the substrate 100 used was a sapphire substrate having a principal growth plane inclined at an angle α (illustrated in FIG. 6A) of 20 degrees. The sapphire substrate 100 used was a product of KYOCERA Corporation. As illustrated in FIG. 6A, the inclination angle α refers to an angle at which the sapphire substrate was inclined with respect to the m-axis (i.e., orientation of the m-plane) of the sapphire substrate in the c-axis direction. In this case, the a-axis serves as a rotation axis.

A semi-polar plane nitride semiconductor was grown on the sapphire substrate 100 as in Reference Example 1. The orientation of the principal plane of the semi-polar plane nitride semiconductor was such that the inclination angle α illustrated in FIG. 6B was about 20 degrees with respect to the [11-22] axis of GaN in the +c-axis direction. In other words, the principal plane of the nitride semiconductor layer 300 prepared in Example 8 was the (11-24) plane.

2. Measurement and Evaluation of Properties

Results of X-Ray Diffraction Measurement

Figure 7A:
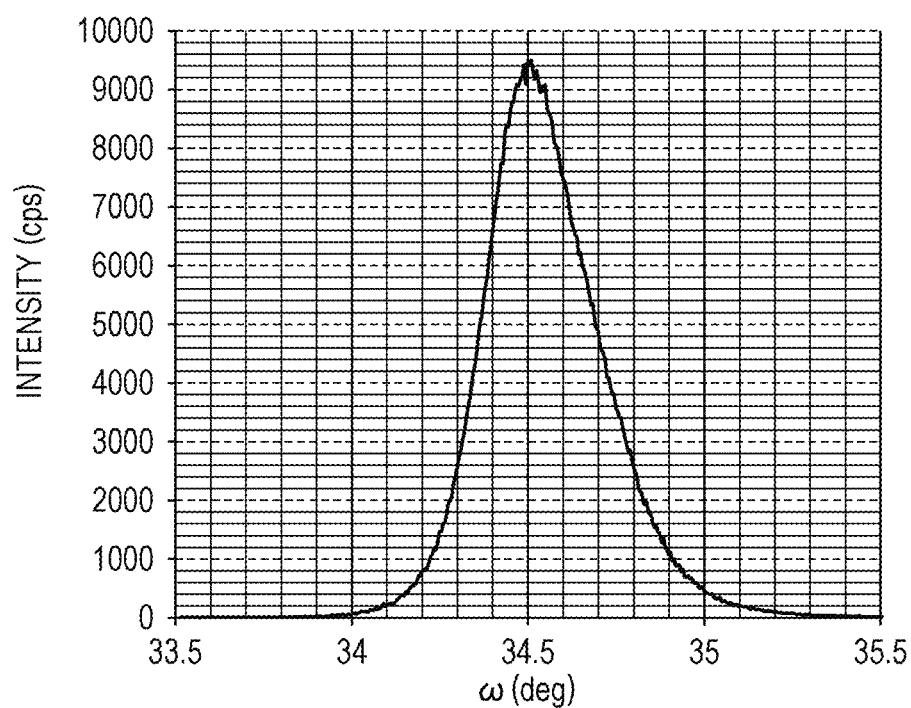
FIG. 7A illustrates the result of measurement of a (11-22) diffraction rocking curve of a nitride semiconductor layer prepared in Reference Example 1.
Figure 7B:
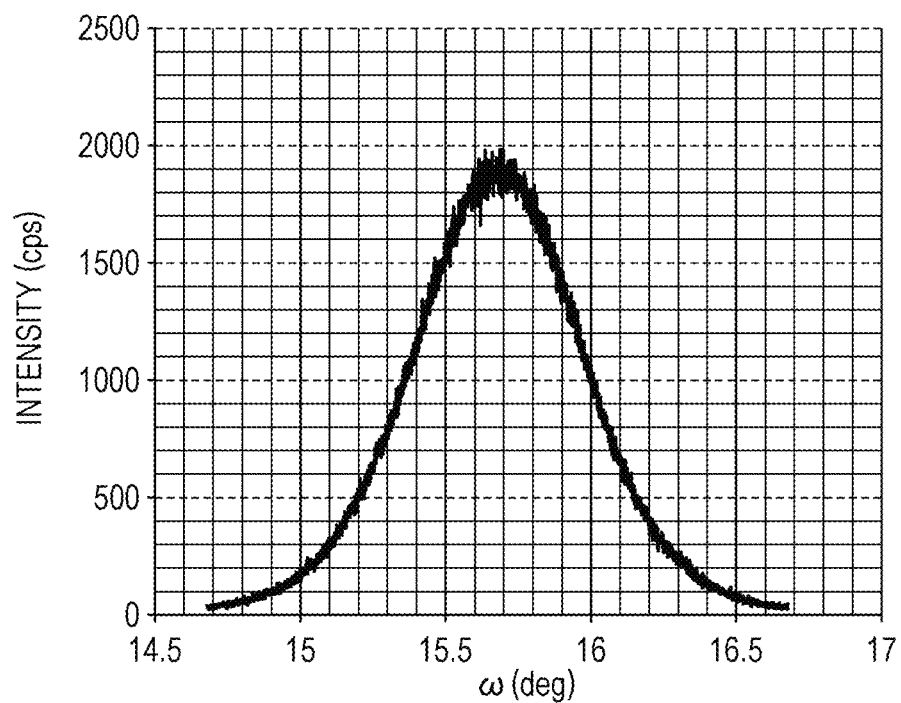
FIG. 7B illustrates the result of measurement of a (0002) diffraction rocking curve of a nitride semiconductor layer prepared in Reference Example 1.

FIGS. 7A and 7B illustrate the X-ray diffraction profiles of the nitride semiconductor layer 300 prepared in Reference Example 1. The crystallinity and dislocation density of the nitride semiconductor layer can be evaluated on the basis of the full width at half maximum (FWHM) of the X-ray rocking curve.

Figure 8A:
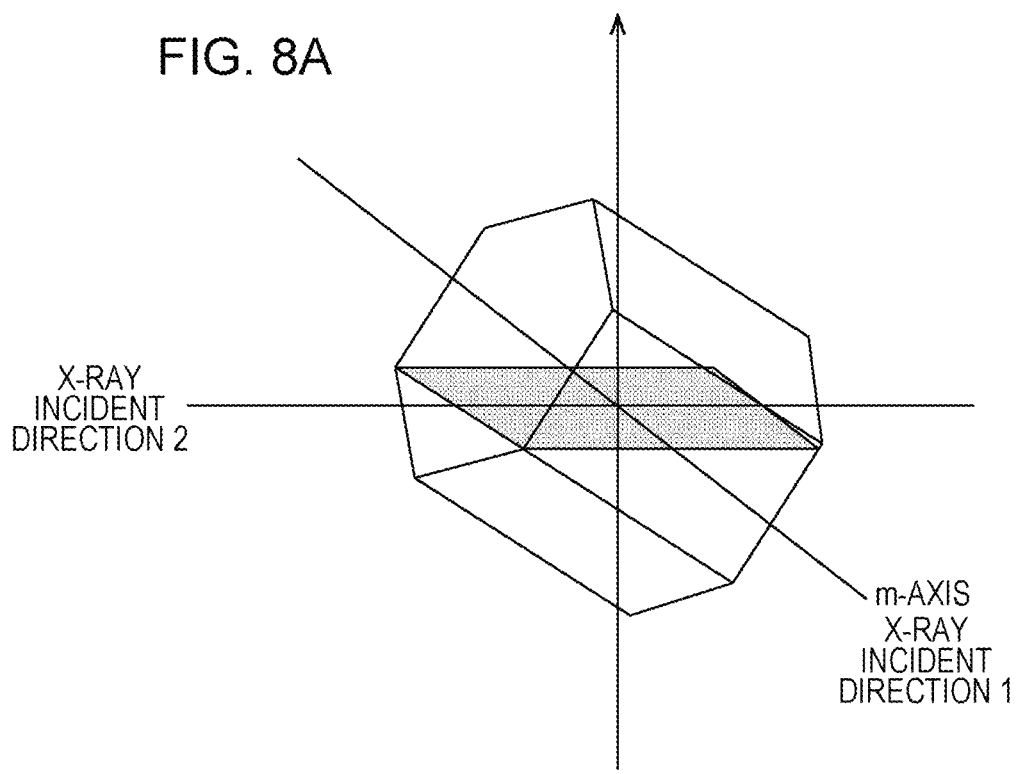
FIG. 8A illustrates the directions of incident X-ray used for (11-22) X-ray diffraction.
Figure 8B:
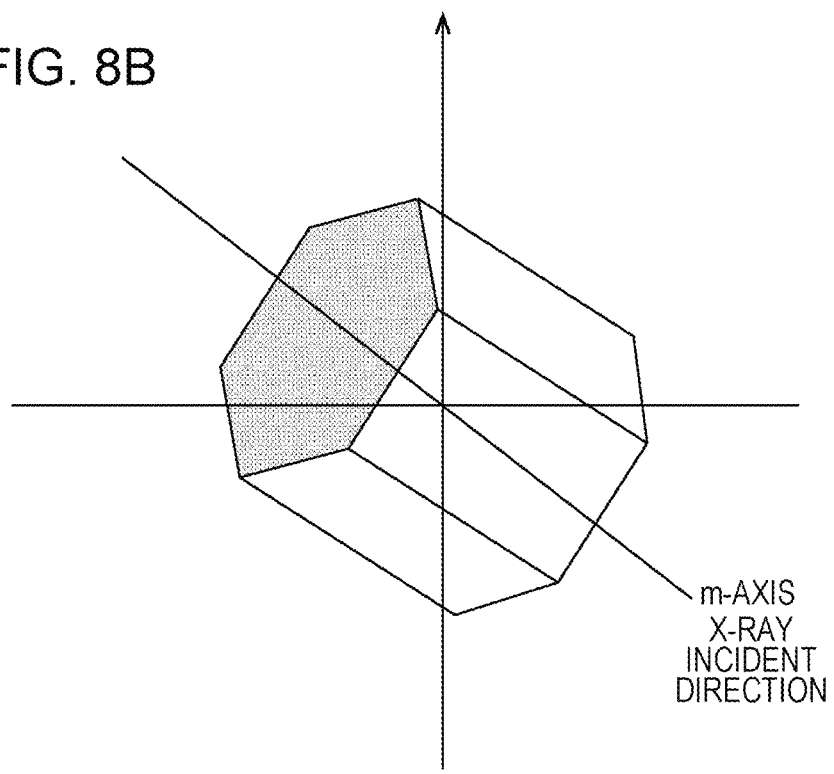
FIG. 8B illustrates the direction of incident X-ray used for (0002) X-ray diffraction.

The crystallinity of the nitride semiconductor layer was evaluated on the basis of (11-22) diffraction that occurred in a plane close to the principal plane of the semi-polar plane nitride semiconductor (FIG. 8A), and (0002) diffraction that occurred in the c-plane (FIG. 8B). In the evaluation of (11-22) diffraction, X-rays were incident in two directions, that is, the m-axis direction and a direction perpendicular to the m-axis in the principal plane of the nitride semiconductor layer (X-ray incident directions 1 and 2 illustrated in FIG. 8A) in order to determine the rocking curves.

When the rocking curves of the samples prepared in Reference Examples 2 and 3 and Examples 4 to 8, in which the inclination angle α was not 0 degrees, were measured in the X-ray incident direction 2, the angle of the incident X-rays was changed depending on the inclination angle α. FIG. 7A illustrates the results of (11-22) diffraction measured in the X-ray incident direction 2.

In the evaluation of (0002) diffraction, X-rays were incident in the direction of the m-axis in the principal plane of the nitride semiconductor layer. In (0002) diffraction, it was necessary to change the angle of the incident X-rays even in Reference Example 1, in which the inclination angle α was set to 0 degrees. Since the c-plane of a (11-22) plane GaN crystal is inclined at about 58 degrees, the sample was placed in the X-ray diffraction system so as to be inclined at an angle (hereinafter, referred to as "tilt angle") of about 58 degrees in order to determine the rocking curve.

As illustrated in FIG. 7A, the diffraction peak of the nitride semiconductor layer 300 prepared in Reference Example 1 was 34.5 degrees, which was substantially equal to the diffraction peak of a (11-22) plane GaN. This shows that the method for growing the nitride semiconductor layer 300 described in Reference Example 1 enables a nitride semiconductor layer 300 having the (11-22) plane serving as a principal plane to be epitaxially grown.

The FWHMs of the X-ray rocking curves illustrated in FIGS. 7A and 7B were 1,237 seconds and 2,300 seconds, respectively, while the FWHMs half width of the rocking curve determined on the (0002) plane of a common polar +c-plane GaN layer which is formed on a c-plane sapphire substrate is less than 1,000 seconds. The FWHM of the rocking curve measured on the (0002) plane of such a GaN layer is of the order of several hundred seconds, although it varies depending on the growth method and conditions employed. It is clear from the comparison of these results that the crystallinity of the semi-polar plane nitride semiconductor prepared in Reference Example 1, in which the inclination angle α was set to 0 degrees, was considerably poor. This is presumably because crystal growth of a semi-polar plane nitride semiconductor is more difficult than the +c-plane growth described above. The dislocation density in the nitride semiconductor layer prepared in Reference Example 1, which was determined from the cross-sectional TEM, was about $10^{10}$ cm$^{-2}$ or more.

Figure 9A:
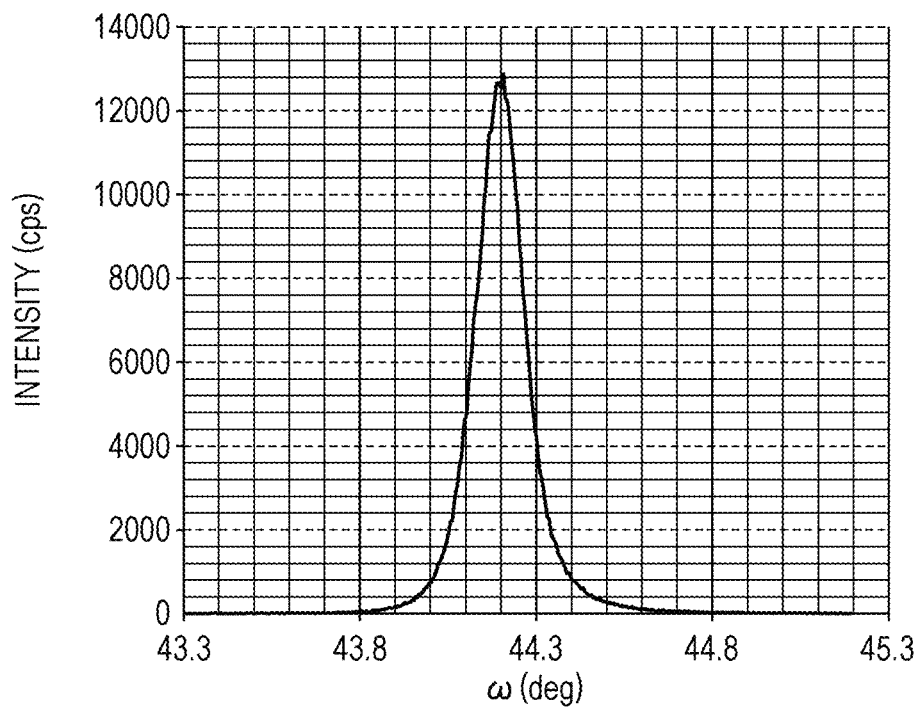
FIG. 9A illustrates the result of measurement of a (11-22) diffraction rocking curve of a nitride semiconductor layer prepared in Example 5.
Figure 9B:
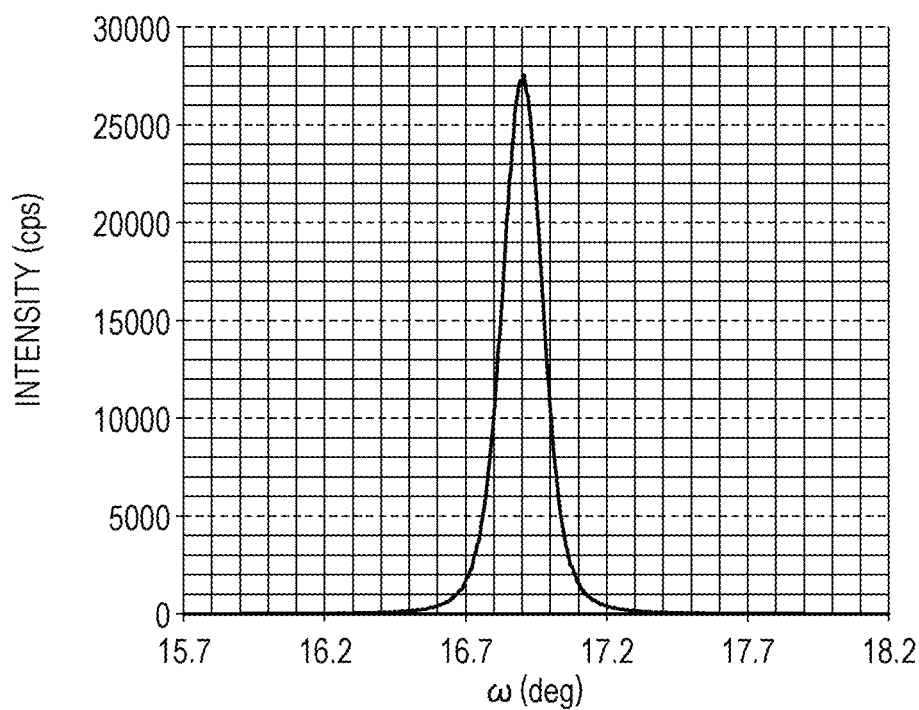
FIG. 9B illustrates the result of measurement of a (0002) diffraction rocking curve of a nitride semiconductor layer prepared in Example 5.

FIGS. 9A and 9B illustrate X-ray diffraction profiles of the nitride semiconductor layer 300 prepared in Example 5. The inclination angle α was set to 10 degrees in Example 5. FIG. 9A illustrates the rocking curves determined by (11-22) diffraction in the X-ray incident direction 2 illustrated in FIG. 8A. FIG. 9B illustrates the rocking curves determined by (0002) diffraction in the X-ray incident direction illustrated in FIG. 8B. As illustrated in FIG. 9A, the (11-22) diffraction peak was shifted from the diffraction peak measured in Reference Example 1, which is illustrated in FIG. 7A, due to the inclination angle α. The diffraction angle measured in Example 5 was 44.2 degrees. That is, the diffraction peak was shifted from that measured in Reference Example 1 by about 10 degrees.

As described above, the inclination angle of the orientation of each nitride semiconductor layer 300 prepared in Examples of the first embodiment varied a certain number of degrees from the inclination angle α. However, the error therebetween was about ±1 degree.

Thus, it was confirmed that the inclination angle of the orientation of the principal plane of the semi-polar plane nitride semiconductor was substantially equal to the inclination angle α of the substrate 100.

The results of (0002) diffraction illustrated in FIG. 9B were obtained by setting the tilt angle to 48.8 degrees. This shows that the c-plane of the nitride semiconductor layer 300 prepared in Example 5 was inclined at 48.8 degrees with respect to the principal plane.

Figure 10A:
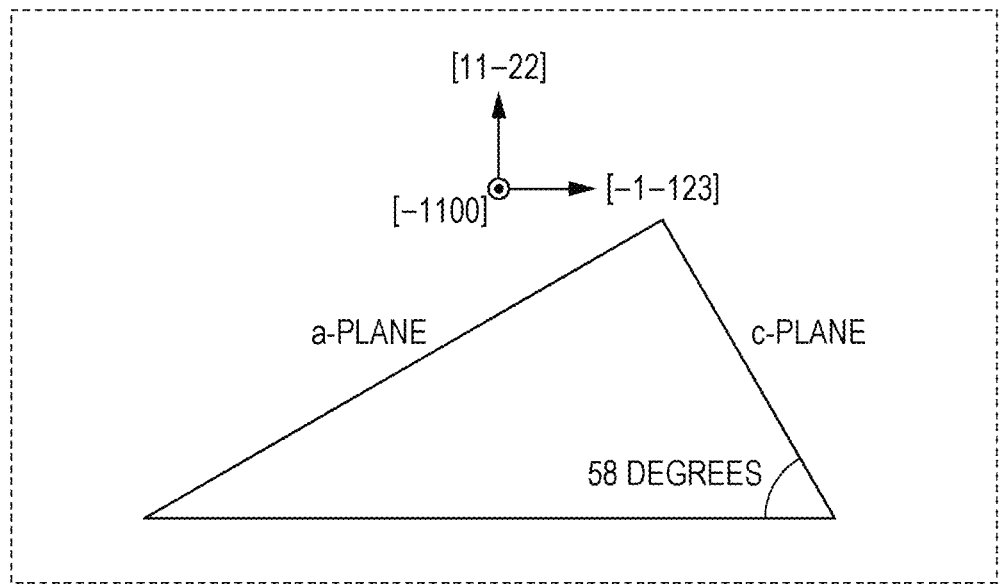
FIG. 10A illustrates the relationship between the plane orientation and the c-plane of a nitride semiconductor prepared in Reference Example 1, which was not inclined.
Figure 10B:
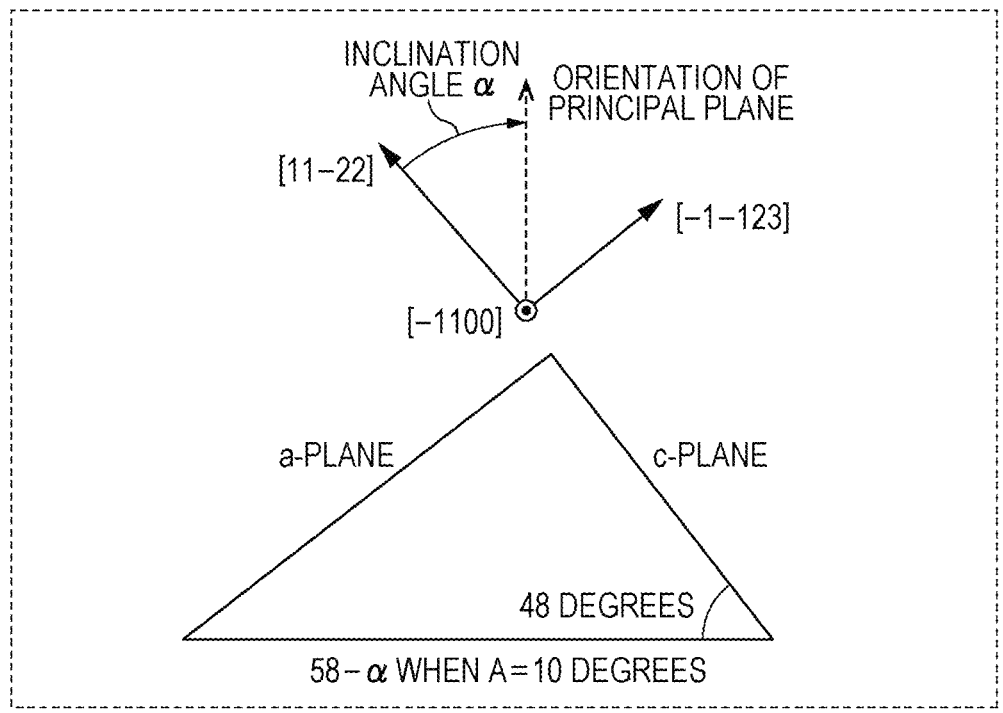
FIG. 10B illustrates the relationship between the plane orientation and the c-plane of a nitride semiconductor prepared in Example 5, which was inclined at an angle α of 10 degrees.

FIGS. 10A and 10B illustrate the relationship between the inclination angle and the orientation of the nitride semiconductor layer. FIG. 10A schematically illustrates the a-plane and c-plane of the nitride semiconductor layer 300 having the (11-22) plane as a principal plane, which was prepared in Reference Example 1. In Reference Example 1, the c-plane of the crystal of the nitride semiconductor layer 300 was inclined at 58 degrees with respect to the principal plane. Thus, the rocking curve illustrated in FIG. 7B was determined by setting the tilt angle to 58 degrees. On the other hand, in Example 5 (inclination angle α=10 degrees), the rocking curve illustrated in FIG. 9B was determined by setting the tilt angle to about 48 degrees. This confirms that, by growing a nitride semiconductor layer on the inclined sapphire substrate 100, a semi-polar plane nitride semiconductor having a principal plane oriented to a direction inclined at 10 degrees with respect to the [11-22] axis can be formed.

Figure 11:
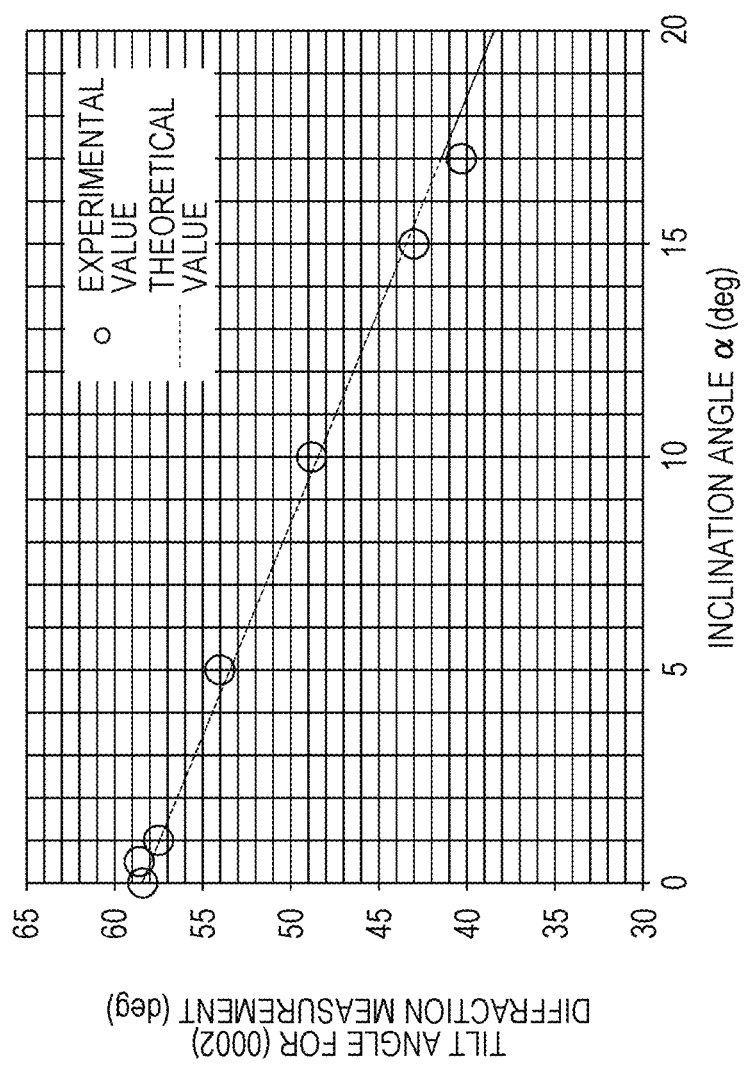
FIG. 11 illustrates the relationship between the inclination angles α and the tilt angles at which (0002) diffraction measurement was conducted in Reference Examples 1 to 6.

FIG. 11 illustrates the relationship between the inclination angles α and the tilt angles of the samples used for performing (0002) diffraction in Reference Examples 1 to 3 and Examples 4 to 7. The inclination angle (i.e., tilt angle) of the c-plane of the nitride semiconductor layer 300 was decreased with an increase in the inclination angle α. This shows that, by using the inclined m-plane sapphire substrate 100, a nitride semiconductor layer 300 having a principal plane inclined with respect to the (11-22) plane in the +c-axis direction can be formed.

If the assumption is made that the principal plane of the m-plane sapphire is parallel to the (11-22) plane of the nitride semiconductor layer, the inclination angle of the c-plane of the nitride semiconductor layer would be 58.4 degrees. The results illustrated in FIG. 11 confirm that the inclination angle of the c-plane of the nitride semiconductor layer substantially corresponds with the inclination angle of the sapphire substrate. In other words, controlling the inclination angle of the sapphire substrate enables the crystallographic orientation of the principal plane of a semi-polar plane nitride semiconductor to be controlled. However, as described above, an error of about ±1 degree occurred at maximum. For example, in Example 7, while the inclination angle of the sapphire substrate used was 17 degrees, the inclination angle of the c-plane of the nitride semiconductor layer prepared was 18.1 degrees.

When the tilt angle of the c-plane was 48 degrees, the semi-polar plane nitride semiconductor layer had the (11-23) plane serving as a principal plane. When the tilt angle of the c-plane was 39 degrees, the semi-polar plane nitride semiconductor layer had the (11-24) plane serving as a principal plane. Thus, it is confirmed that it is possible to control the growth of such a semi-polar plane nitride semiconductor layer in the first embodiment.

The FWHMs of the rocking curves of the nitride semiconductor layer 300 prepared in Example 5 which were determined by (11-22) diffraction (FIG. 9A) and (0002) diffraction (FIG. 9B) were 570 seconds and 598 seconds, respectively. The FWHMs of the rocking curves of the nitride semiconductor layer 300 prepared in Example 5 were on the order of 500 seconds, which was markedly smaller than those (illustrated in FIG. 7) of the nitride semiconductor layer 300 prepared in Reference Example 1, which was formed on the sapphire substrate 100 that was not inclined. The results of Example 5 show that controlling the inclination angle α markedly improves the crystallinity of a semi-polar plane nitride semiconductor, which enables a crystal having a rocking curve half width markedly smaller than 1,000 seconds to be grown.

Figure 12A:
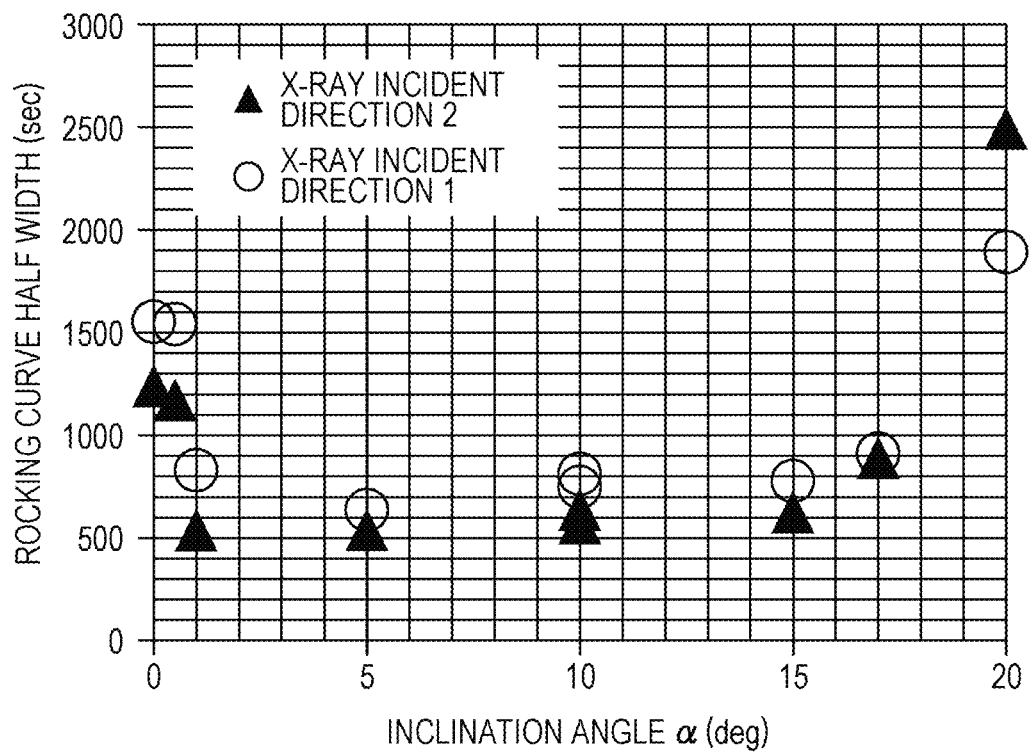
FIG. 12A illustrates the inclination-angle-α dependence of the half widths of (11-22) diffraction rocking curves determined in Reference Examples 1 to 3 and Examples 4 to 8.
Figure 12B:
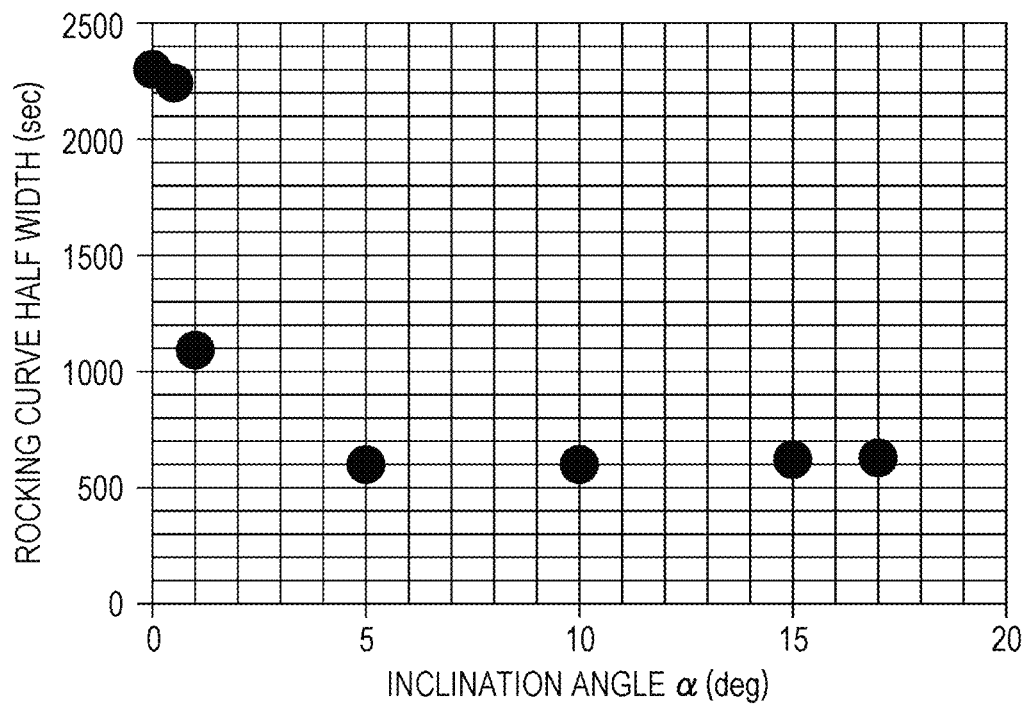
FIG. 12B illustrates the inclination-angle-α dependence of the half widths of (0002) diffraction rocking curves determined in Reference Examples 1 to 3 and Examples 4 to 7.
Figure 13A:
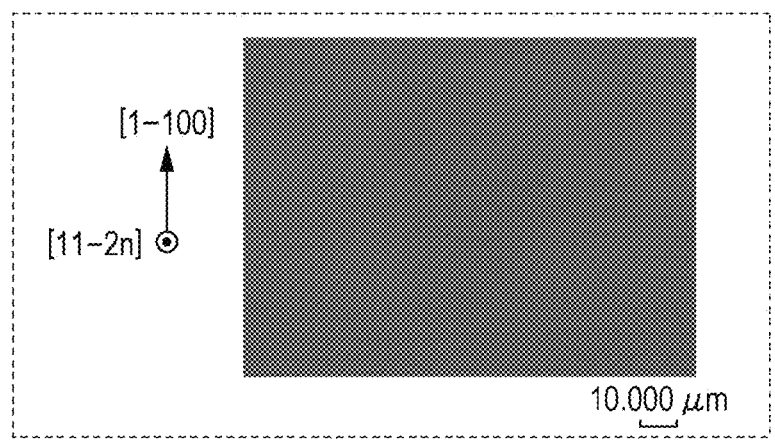
FIGS. 13A to 13C illustrate the surface morphology of nitride semiconductor layers prepared in Reference Examples 1 to 3, respectively.
Figure 13B:
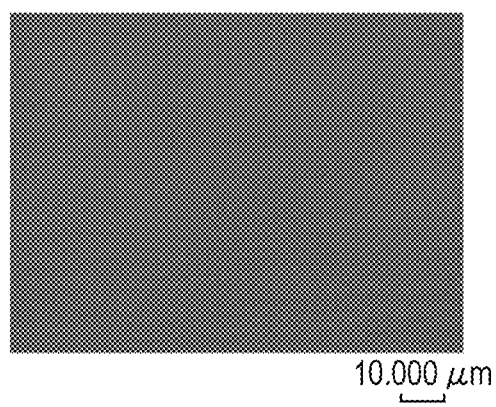
Figure 13C:
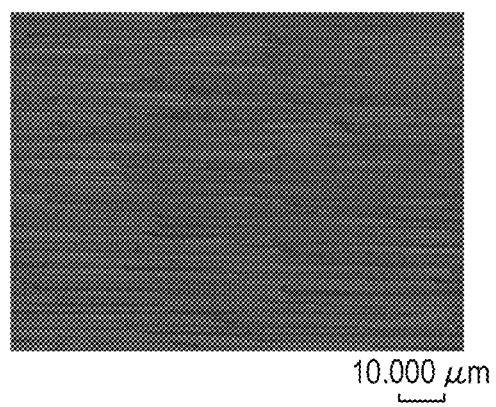
Figure 13D:
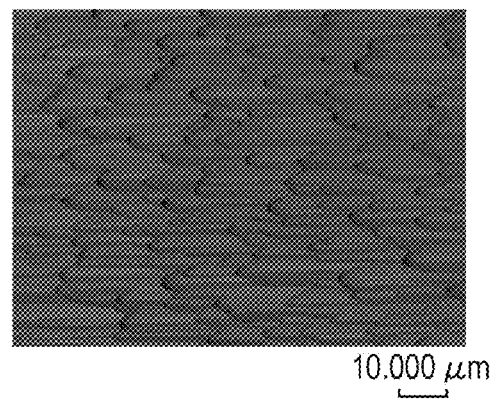
FIGS. 13D to 13G illustrate the surface morphology of nitride semiconductor layers prepared in Examples 4, 5, 6, and 8, respectively.
Figure 13E:
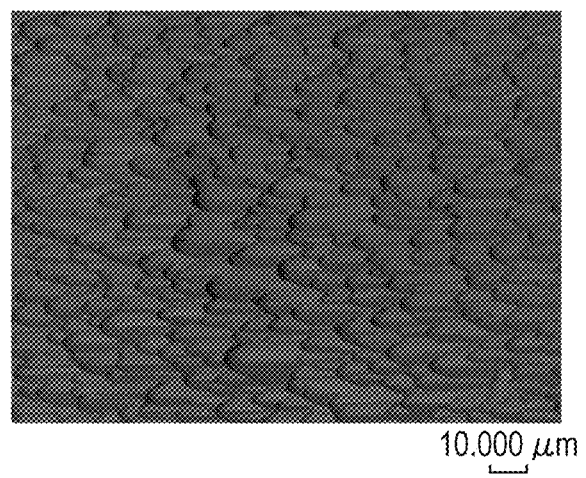
Figure 13F:
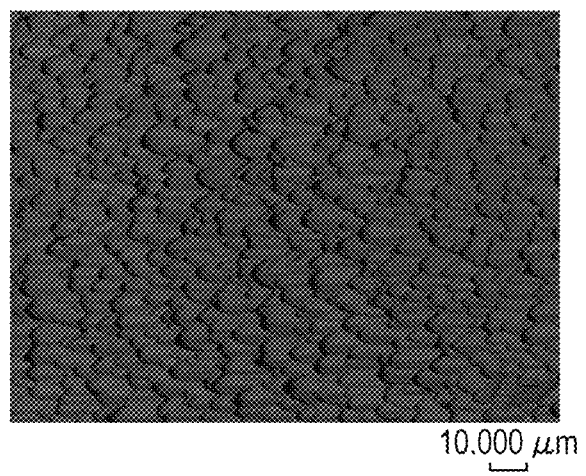
Figure 13G:
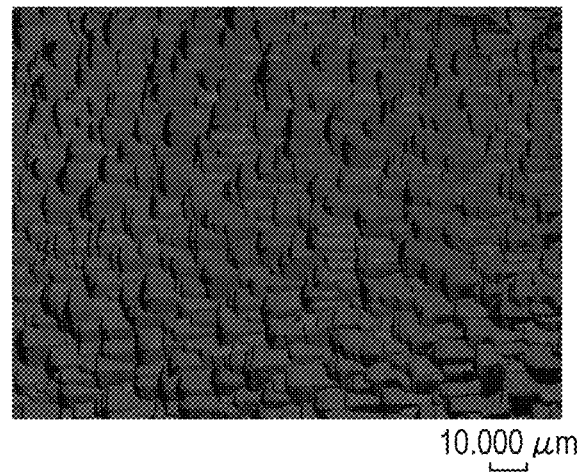

FIGS. 12A and 12B illustrate the results of comparison between the inclination angles α and the FWHMs of rocking curves of the nitride semiconductor layers 300 prepared in Reference Examples 1 to 3 and Examples 4 to 8. FIG. 12A illustrates the results of (11-22) diffraction measured in the X-ray incident directions 1 and 2 illustrated in FIG. 8A. FIG. 12B illustrates the results of (0002) diffraction.

The inclination-angle-α dependence of (11-22) diffraction illustrated in FIG. 12A is described below. When the inclination angle α was 1 degree or more, the FWHM was rapidly decreased, that is, crystallinity was improved. The reduction in FWHM was saturated when the inclination angle was 1 degree or more. Thus, crystallinity can be improved consistently when the inclination angle α is 1 degree a 17 degrees and is desirably 1 degree≤α≤15 degrees. However, when the inclination angle was 20 degrees, the FWHM was rapidly increased. The results of measurement of the FWHMs in two X-ray incident directions illustrated in FIG. 12A show that a difference in the FWHMs due to a difference in the measurement condition (i.e., X-ray incident direction) was small in the case where the samples had a small FWHM and relatively high crystallinity. However, the FWHM tended to be smaller when measured in the X-ray incident direction 2.

The results illustrated in FIG. 12B show a tendency slightly different from that illustrated in FIG. 12A. Although the FWHM determined by (0002) diffraction was decreased with an increase in the inclination angle, the FWHM of the sample in which inclination angle α=1 degree was even large, that is, 1,000 seconds or more. When the inclination angle α was 5 degrees≤α≤17 degrees and was desirably 5 degrees≤α≤15 degrees, a small FWHMr on the order of about 500 seconds was observed. When the inclination angle was 20 degrees, (0002) diffraction peak could not be observed. This is presumably because of degradation of crystallinity due to an increase in inclination angle since the FWHM determined by (11-22) diffraction was considerably large as illustrated in FIG. 12A when the inclination angle was 20 degrees.

It has been reported in Japanese Patent Application No. 2008-551465 that it is desirable to use a miscut substrate whose inclination angle is controlled to 0.5 degrees or more and 20 degrees or less or 0.5 degrees or more and 3 degrees or less. On the other hand, according to the studies conducted by the inventors of the present disclosure, the FWHMs of rocking curves determined by (11-22) diffraction and (0002) diffraction were clearly decreased by controlling the inclination angle α of a nitride semiconductor having a semi-polar plane serving as a principal plane to 5 degrees≤α≤17 degrees and desirably to 5 degrees a 15 degrees. When the inclination angle α was controlled within the above-described range, the FWHM of rocking curve of the semi-polar plane nitride semiconductor layer was about 500 seconds. This shows that crystallinity comparable to that of a polar +c-plane nitride semiconductor was achieved.

The reason for severe degradation of crystallinity which occurred when the inclination angle α was 20 degrees is discussed below.

It is known that a nitride semiconductor layer having the (11-22) plane serving as a principal plane can be grown on an m-plane sapphire substrate having an inclination angle α of 0 degrees.

It is also known that a nitride semiconductor layer having the a-plane serving as a principal plane can be grown on the (10-12) plane (also referred to as "r-plane) sapphire substrate, which is equivalent to an m-plane sapphire substrate inclined at 32 degrees with respect to the m-axis in the c-axis direction.

As is evident from FIG. 5B, when the normal to the principal plane of a (11-22) plane nitride semiconductor layer is rotated 32 degrees around the m-axis of the nitride semiconductor layer in the [−1-123] axis direction, the principal plane of the nitride semiconductor layer becomes equivalent to the a-plane.

Therefore, before this study was carried out, it was considered that, when crystal growth is performed on an m-plane sapphire substrate having an inclination angle α in order to form a semi-polar plane nitride semiconductor structure, the resulting nitride semiconductor layer having the (11-22) plane serving as a principal plane becomes close to a nitride semiconductor layer having the a-plane serving as a principal plane.

However, the opposite results were obtained in this example. The principal plane of the semi-polar plane nitride semiconductor layer formed on the m-plane sapphire substrate having an inclination angle α was inclined in the opposite direction, that is, a direction of the +c-plane.

In other words, the results of the study of the semi-polar plane nitride semiconductor layers prepared in Examples, which were formed on an m-plane sapphire having an inclination angle α, show that increasing the inclination angle α cannot induce crystal growth in a mode close to the epitaxy of an a-plane nitride semiconductor layer on r-plane sapphire.

When the inclination angle α is increased to 20 degrees, the epitaxy conditions become close to those under which an a-plane nitride semiconductor layer is grown on an r-plane sapphire, that is, the epitaxy conditions where the nitride semiconductor layer is inclined at 12 degrees with respect to the r-plane sapphire. Therefore, under such conditions, the above-described two epitaxy relationships may coexist, which presumably significantly deteriorated the crystallinity.

Results of Measurement of Surface Morphology and Cathodoluminescence

Figure 14:
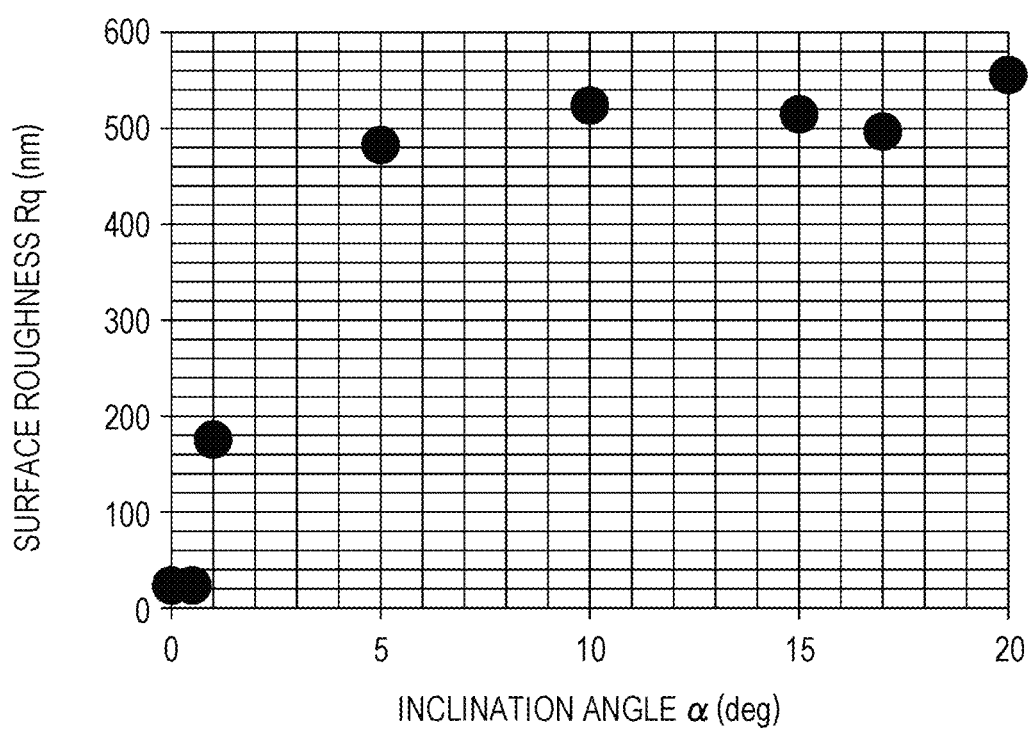
FIG. 14 illustrates the relationship between the values of surface roughness and the inclination angles α of nitride semiconductor layers prepared in Reference Examples 1 to 3 and Examples 4 to 8.

FIGS. 13A to 13G are optical microscope images of the surface morphology of the nitride semiconductor layers prepared in Reference Examples 1 to 3 and Examples 4 to 8. FIG. 14 illustrates the inclination-angle-α dependence of the values of surface roughness (root mean square roughness, Rq) of the nitride semiconductor layers measured by laser microscopy.

As illustrated in FIGS. 13A to 13G and FIG. 14, the surface morphology of the nitride semiconductor layer changed with an increase in the inclination angle α. In particular, when the inclination angle α was 5 degrees or more, the surface roughness of the nitride semiconductor layer was rapidly increased. When the inclination angle was more than 5 degrees, the increase in the surface roughness of the nitride semiconductor layer was substantially saturated. Streaks extending in a direction inclined with respect to the orientation of the principal plane of the nitride semiconductor layer in the c-axis direction (i.e., the direction of the inclination angle α, a direction perpendicular to the m-axis in the principal plane of the nitride semiconductor) were observed in all of the surface morphology images. When the inclination angle α was 0 degrees or 0.5 degrees, the surface smoothness of the nitride semiconductor layer was high and the irregularities formed in the m-axis direction in the surface of the nitride semiconductor layer were hardly observed.

However, when the inclination angle α was 1 degree or more, the surface irregularities of the nitride semiconductor layer which extended in the m-axis direction were clearly observed. Streak-like grains having a certain length were observed in a direction inclined with respect to the orientation of the principal plane of the nitride semiconductor layer in the c-axis direction (i.e., direction of the inclination angle α). The length of the streak-like grains became smaller with an increase in the inclination angle α. The measurement of surface morphology confirmed that these grains were each formed by two opposing {10-11} facet planes.

Figure 15:
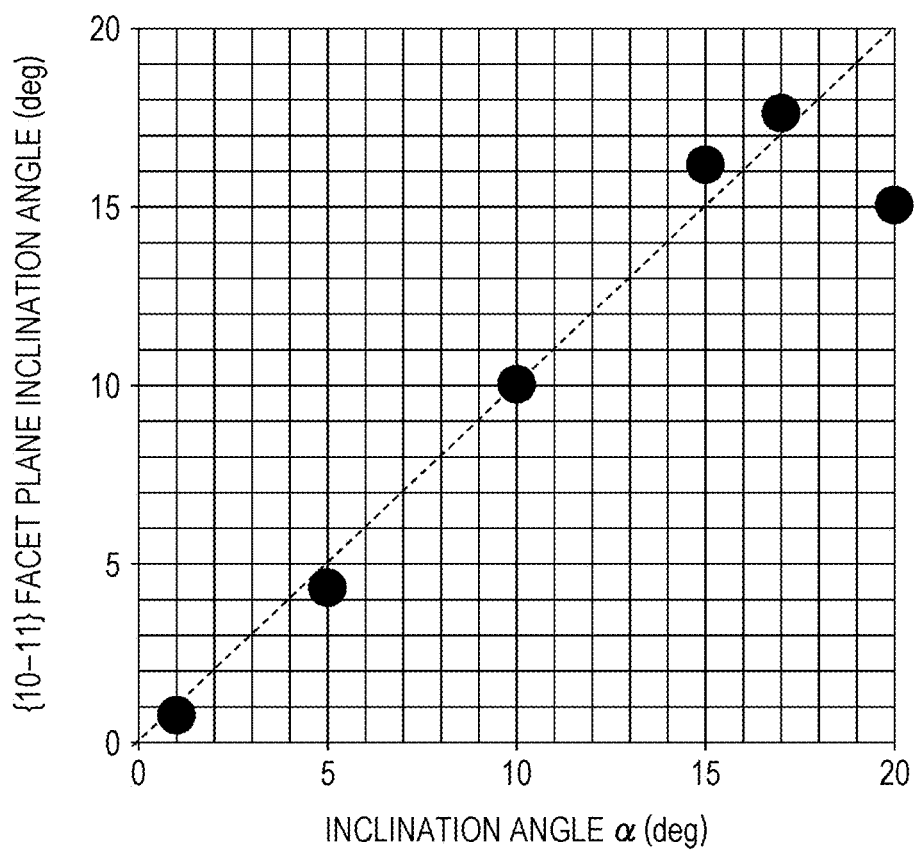
FIG. 15 illustrates the relationship between the inclination angles α of nitride semiconductor layers and the inclination of the {10-11} facet planes in Reference Example 3 and Examples 4 to 8.

As described above with reference to FIG. 4C, when the {10-11} facet planes are formed on the surface of the nitride semiconductor layer, the inclination angle of the {10-11} facet planes is considered to be increased with an increase in the inclination angle α. FIG. 15 illustrates the relationship between the inclination angle α and the inclination angle of the {10-11} facet planes which was determined from the surface morphology illustrated in FIGS. 13A to 13G in a direction perpendicular to the m-axis direction in the principal plane. When the {10-11} facet planes are formed, the length of the grains becomes small because the inclination angle of the facet planes is also increased with an increase in the inclination angle α (see FIG. 4C). It was confirmed that the inclination angle of the {10-11} facet planes was substantially equal to the inclination angle α in the nitride semiconductor layers having an inclination angle α of 1 degree or more, in which formation of the {10-11} facet planes was confirmed.

It is clear from the above-described results that there is a correlation between the control of the inclination angle α and formation of the {10-11} facet planes. Considering the relationships illustrated in FIGS. 14 and 15, it is considered that, when the inclination angle α was 1 degree or less, formation of the {10-11} facet planes was not promoted and therefore the number of dislocations was not reduced by a sufficient degree. On the other hand, when the inclination angle α was 17 degrees or more, a difference between the inclination angle α and the inclination angle of the {10-11} facet planes was large. In particular, when the inclination angle α was set to 20 degrees in Example 8, the difference in the inclination angle α and the inclination angle of the facet planes was about 5 degrees.

Since the results illustrated in FIG. 12A confirm that the orientation of the semi-polar principal plane of the nitride semiconductor layer prepared in Example 8 was inclined at an angle equivalent to the inclination angle α of 20 degrees with respect to the [11-22] axis, it is highly likely that the facets observed on the surface of the nitride semiconductor layer prepared in Example 8 are facets other than the {10-11} planes.

In other words, when the inclination angle α was 20 degrees, the {10-11} facet planes were less likely to be formed and therefore the reduction in dislocation density was not promoted. This presumably increased the half width of the X-ray rocking curve as illustrated in FIG. 12A.

FIGS. 16A to 16F illustrate the inclination-angle-α dependence of scanning electron microscope (SEM) images and cathodoluminescence (CL) images. FIGS. 16A to 16F each include a SEM image magnified ten thousand times shown on the right side and a CL image shown on the left side, which were taken at the same position. The SEM and CL images were taken at room temperature. The CL images shown are panchromatic images (without spectral dispersion). It is know from the studies of c-plane GaN that the dark spots observed in the CL images illustrated in FIGS. 16A to 16F are formed due to screw dislocations and mixed dislocations. That is, when the number of the dark spots is small, dislocation density is small and crystallinity is high.

The results of the CL measurement illustrated in FIGS. 16A to 16F had a close relationship with the inclination-angle-α dependence of the rocking curve half width determined by (0002) diffraction illustrated in FIG. 12B.

Figure 16A:
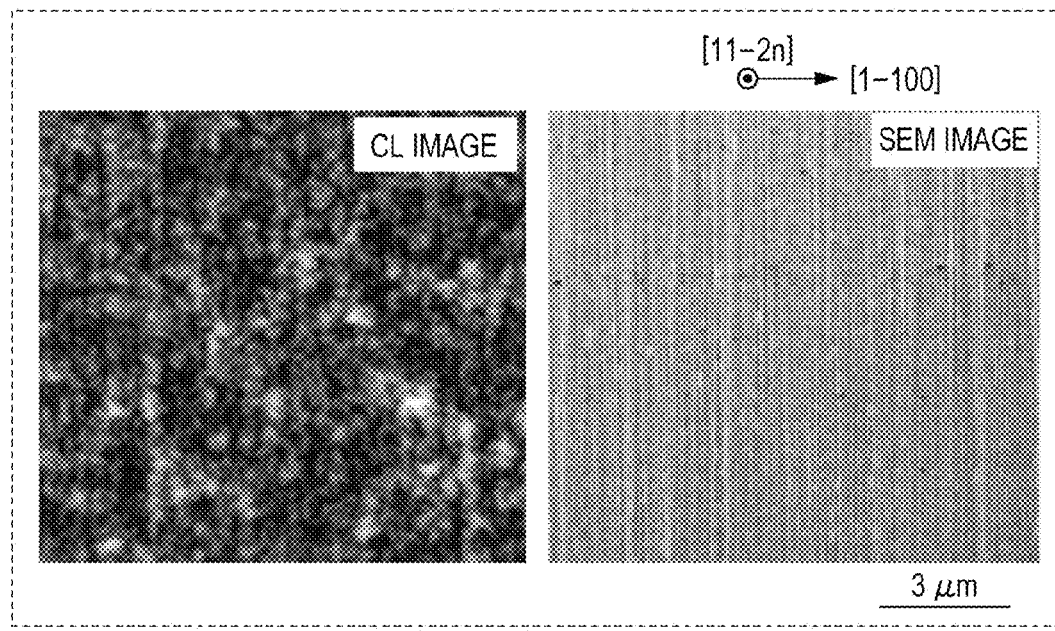
FIGS. 16A to 16C include the scanning electron microscope (SEM) images and cathodoluminescence (CL) images of nitride semiconductor layers prepared in Reference Examples 1 to 3, respectively.
Figure 16B:
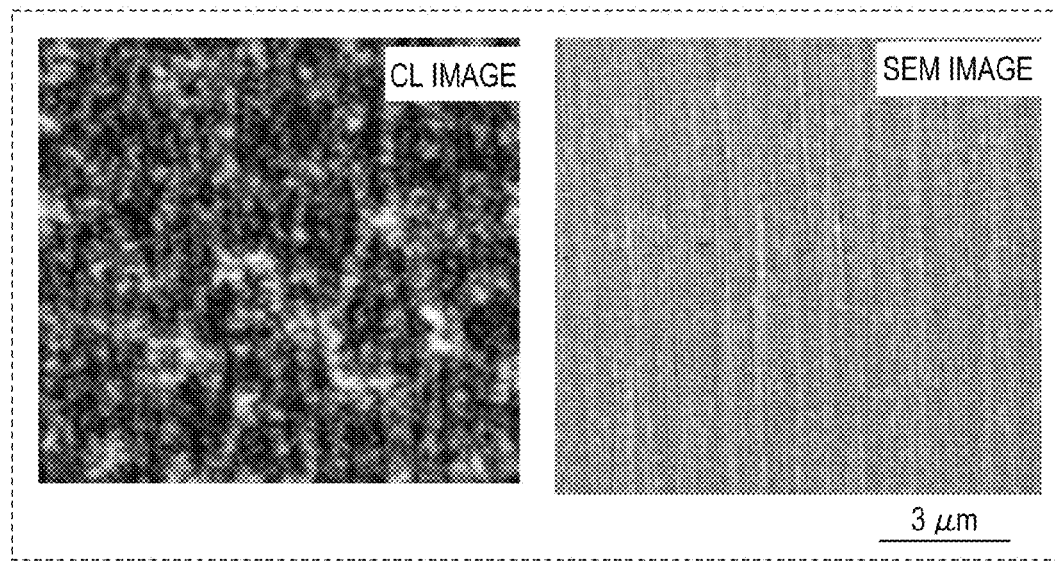

FIGS. 16A and 16B illustrate the results of the SEM and CL measurements conducted in Reference Examples 1 and 2 (where the inclination angles α were 0 degrees and 0.5 degrees, respectively). In Reference Examples 1 and 2, while the surfaces of the samples appeared relatively flat in the SEM images as in FIGS. 13A and 13B, the substantially entire surfaces of the samples were filled with dark spots and little luminous regions were present in the CL images. These results reflect the increase in the half width of the X-ray rocking curve which is observed in FIGS. 12A and 12B and suggest the presence of dislocations with a considerably high density (more than $10^{10}$ cm$^{-2}$).

In Reference Example 3 (inclination angle α=1 degree) illustrated in FIG. 16C, the pattern of {10-11} facet planes described with reference to FIG. 4C was observed in the SEM image. Furthermore, many luminous regions were observed in the CL image. This shows that the density of the dark spots, that is, dislocation density, was low compared with Reference Examples 1 and 2.

Figure 16C:
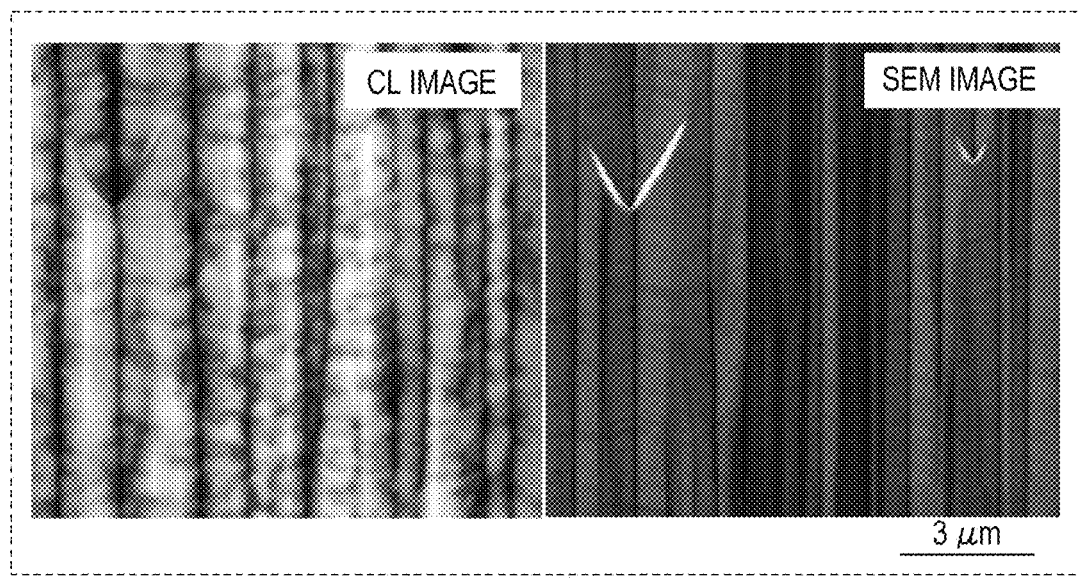
Figure 16D:
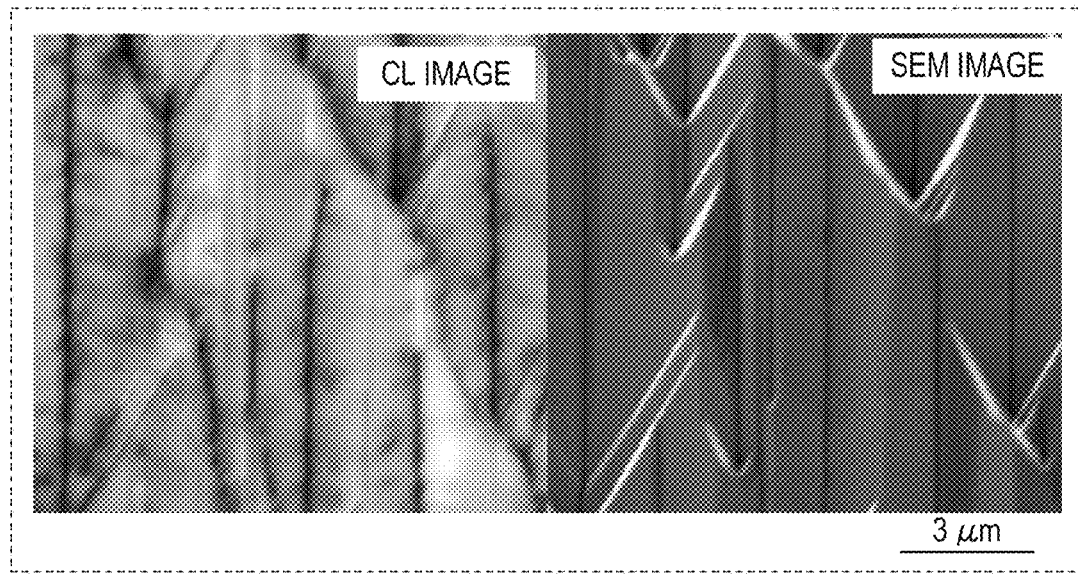
FIGS. 16D to 16F include the scanning electron microscope (SEM) images and cathodoluminescence (CL) images of nitride semiconductor layers prepared in Examples 4 to 6, respectively.
Figure 16E:
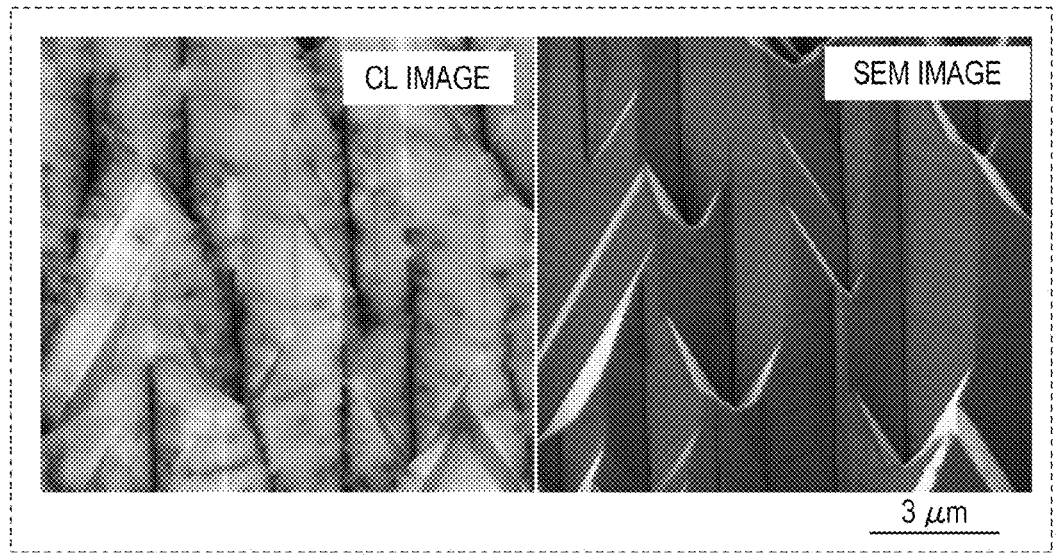
Figure 16F:
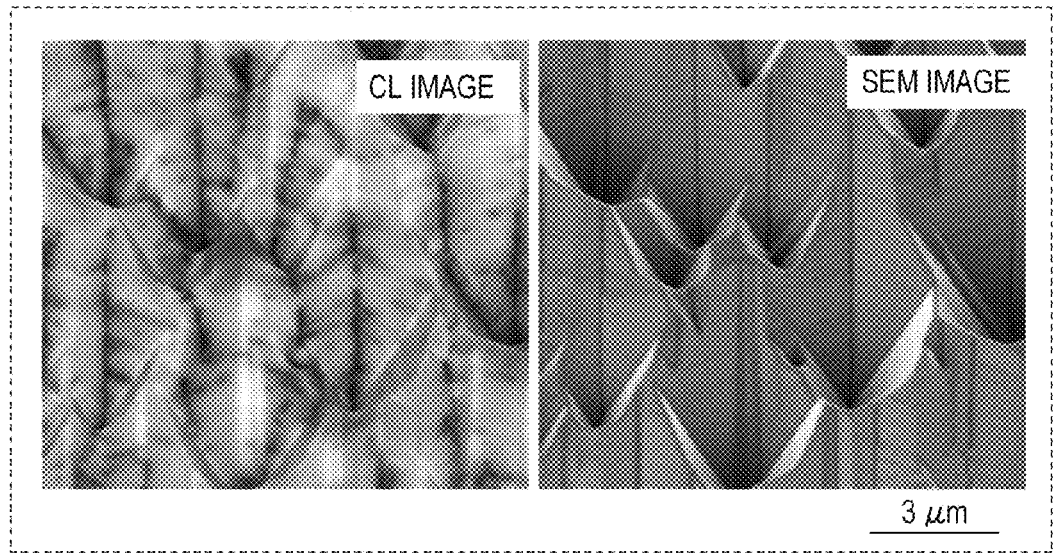

FIGS. 16D, 16E, and 16F illustrate the results of the SEM and CL measurements conducted in Examples 4, 5, and 6 (inclination angles α=5, 10, and 15 degrees), respectively. When the inclination angle α was 5 degrees or more, the pattern of the {10-11} facet planes formed on the surface of the sample was able to be observed more clearly. In addition, the density of the dark spots in the CL image was considerably low compared with the density of the dark spots observed in Reference Example 3. Dark lines extending in a direction inclined with respect to the orientation of the principal plane of the nitride semiconductor layer in the c-axis direction (i.e., the direction of the inclination angle α) were also confirmed. The dark lines corresponded to the recesses (i.e., valley portions) formed between the {10-11} facet planes (see FIG. 3). The dark lines were presumably constituted by the aggregation of a number of dark spots. Thus, it is considered that dislocations are concentrated at the recesses formed between the {10-11} facet planes.

The results illustrated in FIGS. 16A to 16F show that the process of forming the {10-11} facet planes by controlling the inclination angle α promotes a reduction in dislocation density. In FIGS. 16A to 16F, a reduction in the density of dark spots was observed in the samples where the inclination angle α was set to 1 degree or more. The reduction in the density of dark spots and the reduction in the number of dark lines were particularly significant when the inclination angle α was 5 degrees or more and 15 degrees or less. This shows that there is a great difference in crystallinity between a sample where the inclination angle α was set to 1 degree and samples where the inclination angle α was set to 5 degrees or more. The above-described tendency shows that what reflects a reduction of dislocation density more is not the inclination-angle-α-dependence of the FWHM of X-ray rocking curve measured in the (11-22) diffraction (FIG. 12A), but the inclination-angle-α-dependence of the FWHM of X-ray rocking curve measured in the (0002) diffraction (FIG. 12B).

Therefore, considering the results of the measurement of (0002) diffraction, it is considered that a reduction in density of dark spots achieved when the inclination angle α was set to 17 degrees was comparable to that achieved when the inclination angle α was set to 5 degrees or more and 15 degrees or less.

It was confirmed from the above-described results that a reduction in dislocation density can be achieved by controlling the inclination angle α within 1 degree≤α≤17 degrees, desirably within 1 degree≤α≤15 degrees or 5 degrees≤α≤17 degrees, and more desirably 5 degrees≤α≤15 degrees.

Verification of Mechanism for Reducing Dislocations by Cross-Sectional TEM

Figure 17A:
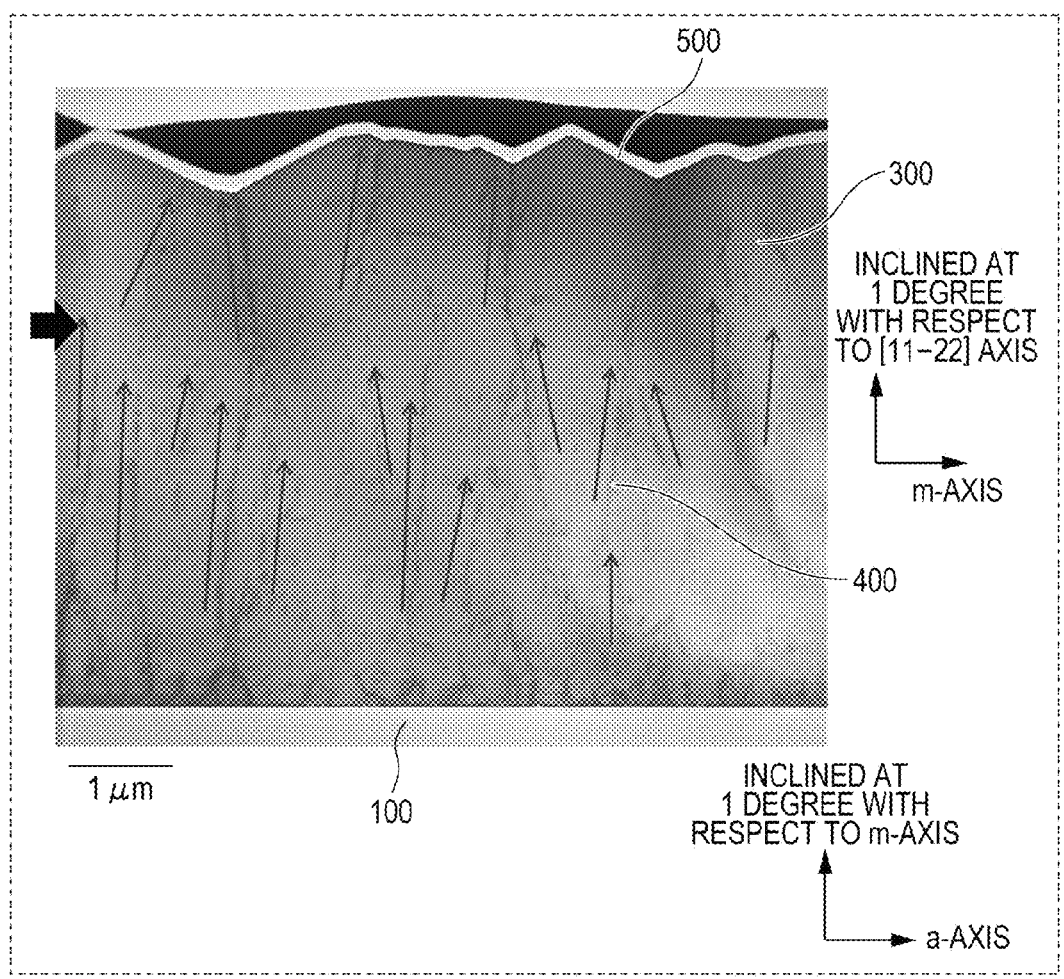
FIG. 17A illustrates a cross-sectional transmission electron microscope (TEM) image of a nitride semiconductor structure prepared in Reference Example 3.

The mechanism for reducing dislocation density by controlling the inclination angle α was evaluated by cross-sectional TEM. FIG. 17A illustrates the results of cross-sectional TEM of the sample prepared in Reference Example 3 (inclination angle α=1 degree). The thickness of the nitride semiconductor layer 300 was reduced to about 100 nm. Specifically, in order to measure a cross section of the nitride semiconductor layer which is perpendicular to the m-axis, the thickness of the nitride semiconductor layer 300 was reduced to about 100 nm in the axis perpendicular to m-axis [1-100] illustrated in FIG. 6B.

Figure 17B:
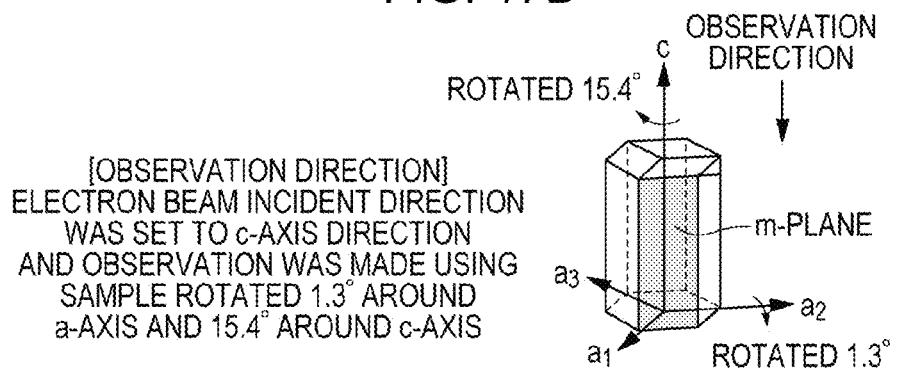
FIG. 17B illustrates the direction of the incident electron beam used for forming a cross-sectional TEM image in Reference Example 3.

The TEM image illustrated in FIG. 17A is a bright-field image. In order to examine the behavior of dislocations, the direction of the incident electron beam was inclined at a certain angle with respect to the direction of the normal to the surface of the thin piece of nitride semiconductor layer 300. FIG. 17B illustrates the angle of the incident electron beam used for observing the TEM image. In FIG. 17B, the angle of the incident electron beam is described in comparison with the crystallographic axis directions of sapphire constituting the substrate.

The sapphire substrate 100 and the nitride semiconductor layer 300 grown on the sapphire substrate 100 are confirmed in FIG. 17A. High-density dislocations occurred in the vicinity of the interface between the nitride semiconductor layer 300 and the substrate 100 and extended toward a portion of the nitride semiconductor layer 300 in the vicinity of the surface of the nitride semiconductor layer 300 as the nitride semiconductor layer was grown. Specifically, the dislocations extended toward the surface of the nitride semiconductor layer 300 in a direction inclined at about 10 degrees with respect to the growth direction. Bending of dislocations as observed in Reference Example 3 was not observed in the nitride semiconductor layers 300 prepared in Reference Examples 1 and 2, where the inclination angles were set to 0 degrees and 0.5 degrees, respectively. This shows that controlling the inclination angle α to 1 degree or more enables dislocations to be bent as described above.

The results illustrated in FIG. 17A confirm that bending of dislocation caused the dislocations to be combined with one another and, as a result, the dislocation density in the vicinity of the growth surface became lower than in the vicinity of the interface. The dislocation density was calculated by counting the number of dislocations at the height denoted by the arrow illustrated in FIG. 17A on the left. The number of dislocations was 10. Since the thickness of the thin piece was 100 nm, the dislocation density was about $1.3 \times 10^9$ cm$^{-2}$, which was about one order of magnitude lower than that in the nitride semiconductor layer prepared in Reference Example 1, where the inclination angle was set to 0 degrees. Presence of the {10-11} facet planes was confirmed in the vicinity of the growth surface illustrated in FIG. 17A. It was also confirmed that the dislocations were terminated at the recesses formed by the facets. This shows that, in order to reduce dislocation density in the first embodiment, it is important to control formation of the {10-11} facet planes as well as the inclination angle α.

Figure 18A:
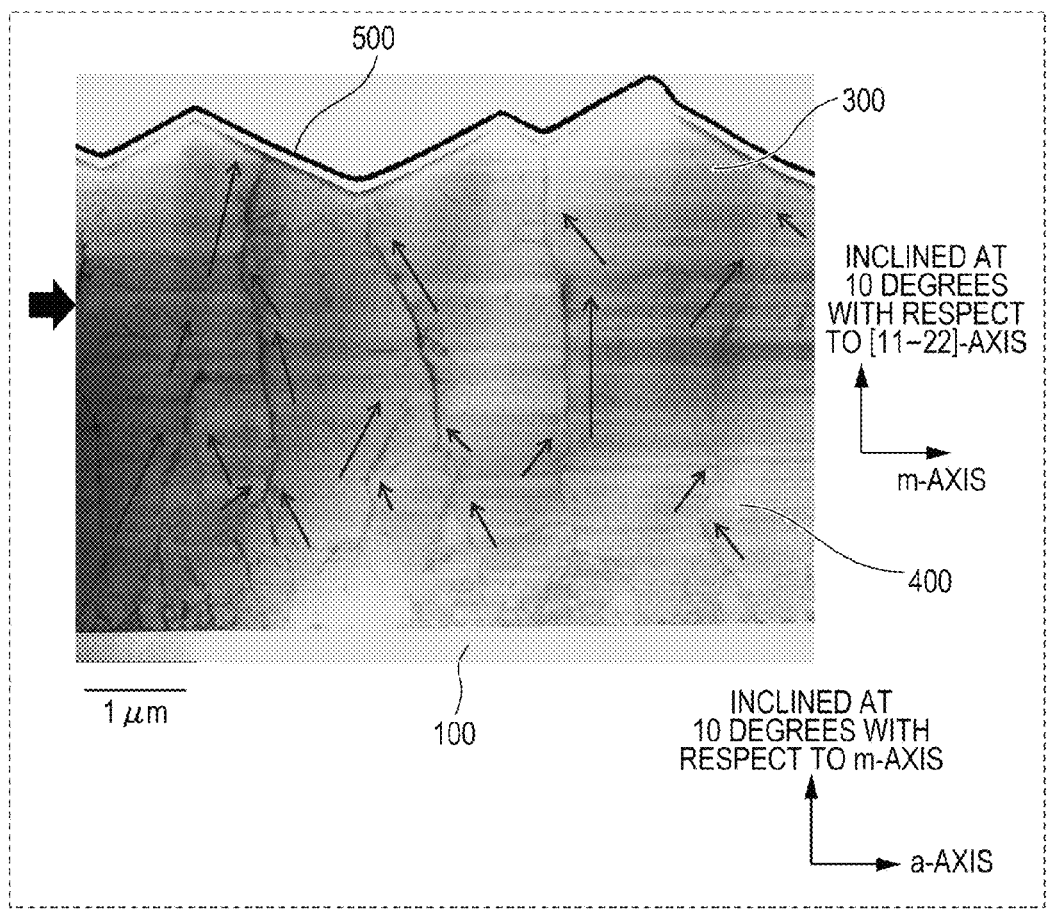
FIG. 18A illustrates a cross-sectional transmission electron microscope (TEM) image of a nitride semiconductor structure prepared in Example 5.
Figure 18B:
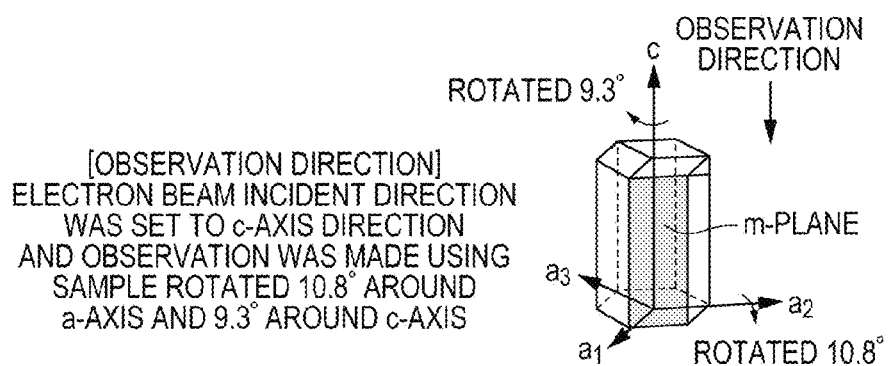
FIG. 18B illustrates the direction of the incident electron beam used for forming a cross-sectional TEM image in Example 5.

FIG. 18A illustrates the results of cross-sectional TEM of the nitride semiconductor layer 300 prepared in Example 5 (inclination angle α=10 degrees). The thickness of the nitride semiconductor layer 300 was reduced to about 100 nm. Specifically, in order to measure a cross section of the nitride semiconductor layer which is perpendicular to the m-axis, the thickness of the nitride semiconductor layer 300 was reduced to about 100 nm in the m-axis direction illustrated in FIG. 6B. The TEM image illustrated in FIG. 18A is a bright-field image. In order to examine the behavior of dislocations, the direction of the incident electron beam was inclined at a certain angle with respect to the direction of the normal to the surface of the thin piece of nitride semiconductor layer 300. FIG. 18B illustrates the angle of the incident electron beam used for observing the TEM image. In FIG. 18B, the angle of the incident electron beam is described in comparison with the crystallographic axis directions of sapphire constituting the substrate.

As in the results illustrated in FIG. 17A, the results illustrated in FIG. 18A also confirm that a number of dislocations occurred in the vicinity of the interface between the nitride semiconductor layer 300 and the substrate 100 and extended in the growth direction while the number of the dislocations was decreased. The bending angle of the dislocations observed in FIG. 18A was clearly different from that observed in FIG. 17A. In FIG. 18A, a number of dislocations had a bending angle of more than 30 degrees. The reason for the increase in the bending angle of the dislocation is presumably that inclination angle α was increased to 10 degrees, which also promoted a reduction in dislocation density in the vicinity of the surface of the nitride semiconductor layer.

The dislocation density was calculated by counting the number of dislocations at the height denoted by the arrow illustrated in FIG. 18A on the left. The dislocation density was about $5.4 \times 10^8$ cm$^{-2}$, which was less than half the dislocation density measured when the inclination angle was set to 1 degree (FIG. 17A) and was about two orders of magnitude lower than the dislocation density of the nitride semiconductor layer prepared in Reference Example 1, where the inclination angle was set to 0 degrees. Presence of the {10-11} facet planes was also confirmed in the vicinity of the growth surface illustrated in FIG. 18A. The dislocations were terminated at the recesses formed by the facets. This shows that, in order to reduce dislocation density in the first embodiment, it is important to control formation of the {10-11} facet planes as well as the inclination angle α.

Figure 18C:
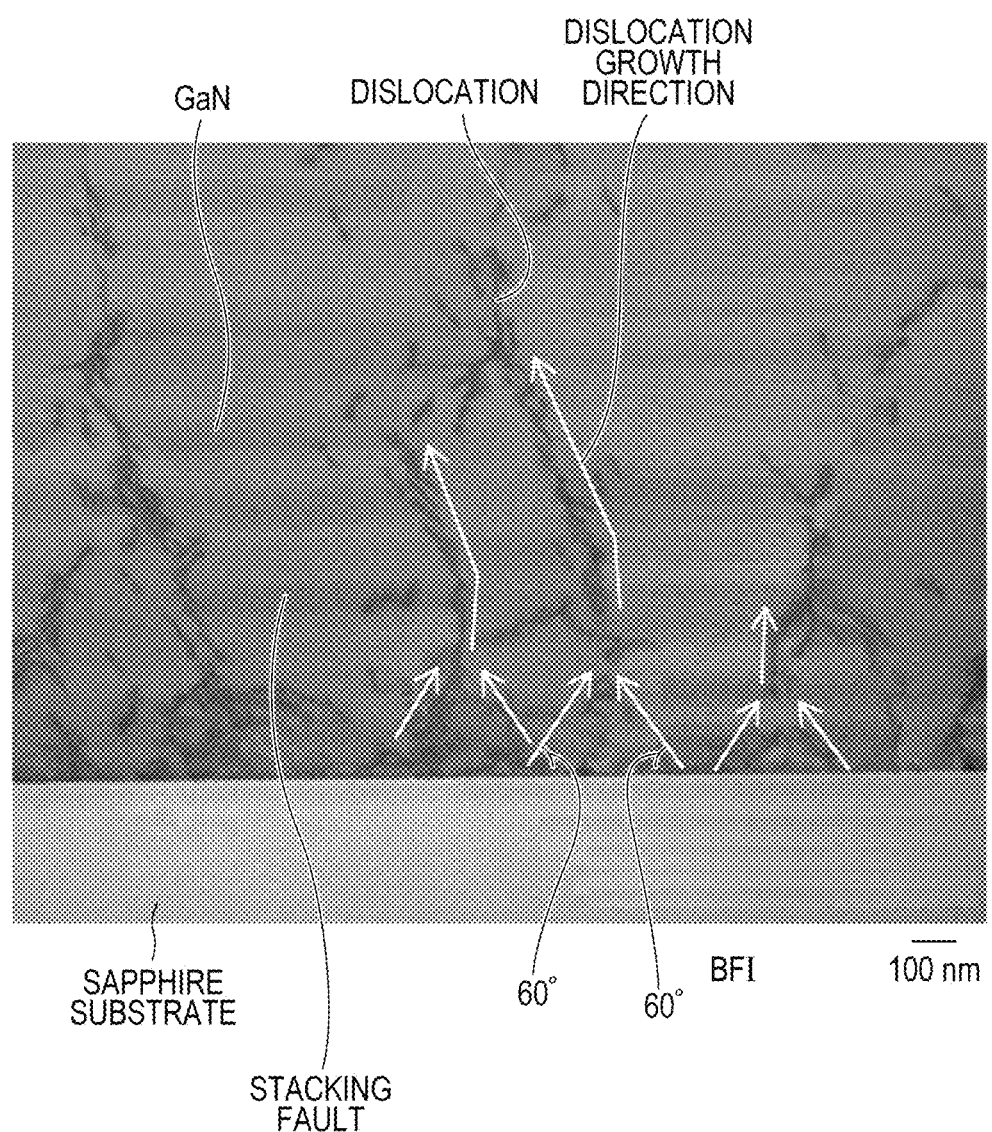
FIG. 18C is an enlarged view of the GaN/sapphire substrate interface observed in a cross-sectional TEM image formed in Example 5.

FIG. 18C is a cross-sectional TEM image taken in the vicinity of the interface between the nitride semiconductor layer 300 prepared in Example 5 (inclination angle α=10 degrees) and the substrate 100. Bending of dislocations was also observed in the vicinity of the interface, and it was again confirmed that promoting bending of dislocations reduces the dislocation density in the vicinity of the surface of the nitride semiconductor layer. The results illustrated in FIG. 18C show that the nitride semiconductor layer requires a certain thickness or more in order to achieve a reduction in dislocation density. The nitride semiconductor layer desirably has a thickness of 500 nm or more. When the thickness of the nitride semiconductor layer is 500 nm or more, dislocations are combined with one another, which reduces the dislocation density in the vicinity of the surface of the nitride semiconductor layer.

Table 2 summarizes the inclination angles α, the FWHMs of X-ray rocking curves measured by (11-22) diffraction and (0002) diffraction, and the dislocation densities calculated by cross-sectional TEM of the samples prepared in Reference Examples 1 to 3 and Examples 4 to 8.

TABLE 2

| Sample | Inclination angle α (deg) | (11-22) Diffraction half width: X-ray incident direction 2 (sec) | (0002) Diffraction half width (sec) | Dislocation density |
|---|---|---|---|---|
| Reference example 1 | 0 | 1,237 | 2,300 | About $10^{10}$ cm$^{-2}$ or more |
| Reference example 2 | 0.5 | 1,171 | 2,241 | |
| Reference example 3 | 1 | 536 | 1,091 | $1.3 \times 10^9$ cm$^{-2}$ |

TABLE 2-continued

| Sample | Inclination angle α (deg) | (11-22) Diffraction half width: X-ray incident direction 2 (sec) | (0002) Diffraction half width (sec) | Dislocation density |
|---|---|---|---|---|
| Example 4 | 5 | 537 | 598 | |
| Example 5 | 10 | 570 | 598 | $5.4 \times 10^8$ cm$^{-2}$ |
| Example 6 | 15 | 625 | 620 | |
| Example 7 | 17 | 888 | 628 | |
| Example 8 | 20 | 2,493 | | |

With consideration of the results of measurement of X-ray rocking curves, calculation of dislocation densities by cross-sectional TEM, and calculation of the densities of dark spots using CL images illustrated in FIGS. 16A to 16C above, it is considered that what strongly reflects the information of dislocation density were not the results of (11-22) diffraction but the results of (0002) diffraction. These results show that the inclination angle α is desirably 5 degrees or more and 17 degrees or less and is more desirably 5 degrees or more and 15 degrees or less. In semi-polar plane nitride semiconductor structures having an inclination angle controlled within the above-described range, the FWHMs of X-ray rocking curves half widths measured by (11-22) diffraction and (0002) diffraction were each around 500 seconds, which were comparable to the crystallinity of a film that is hetero-epitaxially grown on a polar +c-plane nitride semiconductor. Thus, according to the first embodiment, a nitride semiconductor structure having a high crystal quality, that is, a low dislocation density of $10^8$ cm$^{-2}$ or less, can be formed although it has been considered to be difficult to perform crystal growth of a semi-polar plane nitride semiconductor.

Example 9

Controlling Surface Morphology by Low-Pressure Growth

As described above, dislocation density can be reduced by setting the inclination angle α to 5 degrees or more and 17 degrees or less and desirably setting to 5 degrees or more and 15 degrees or less as in Examples 4 to 7, and formation of the {10-11} facet planes plays a great role on the mechanism for reducing dislocation density.

In the first embodiment, it is essential that the {10-11} facet planes and their effect of reducing dislocation density be included in a portion of the nitride semiconductor structure. In other words, the surface of the nitride semiconductor layer 300 may be flattened by changing the growth conditions after the nitride semiconductor layer 300 are grown under growth conditions under which the {10-11} facet planes are formed on the growth surface as in Examples 4 to 7. Thus, forming the {10-11} facet planes on the growth surface after the nitride semiconductor multilayer structure is formed is not necessarily required for achieving the advantageous effect of the first embodiment.

An example where the surface morphology of the nitride semiconductor layer 300 is flattened is described below. In Example 9, a nitride semiconductor layer was grown as in Reference Example 1, except that the substrate 100 used was a sapphire substrate having a principal growth plane inclined at an angle α of 5 degrees as illustrated in FIG. 6A and the growth conditions described in Table 3 were employed instead of the conditions described in Table 1.

TABLE 3

| | |
|---|---|
| Flow rate of TMG | 136 μmol/min |
| Flow rate of ammonia | 0.5 L/min |
| Growth rate of nitride semiconductor layer 300 | About 5 μm/hr |
| Growth time of nitride semiconductor layer 300 | 1 hr |
| Growth pressure | 13 kPa |
| Ammonia/TMG charge ratio (molar ratio) | About 160 |

Figure 19A:
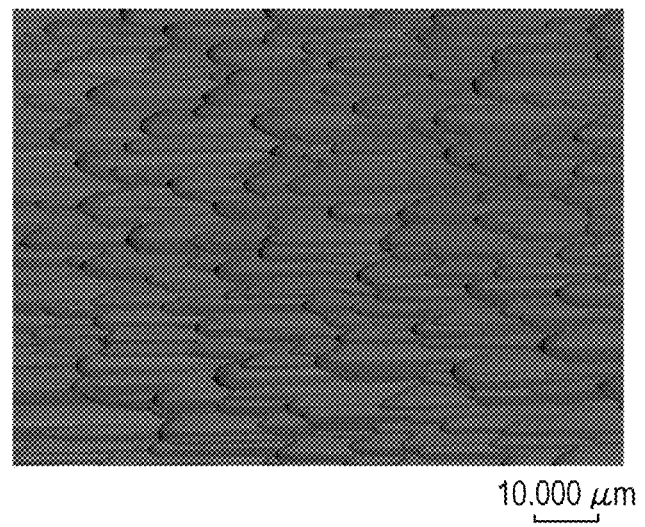
FIG. 19A illustrates the surface morphology of a nitride semiconductor layer prepared in Example 4.
Figure 19B:
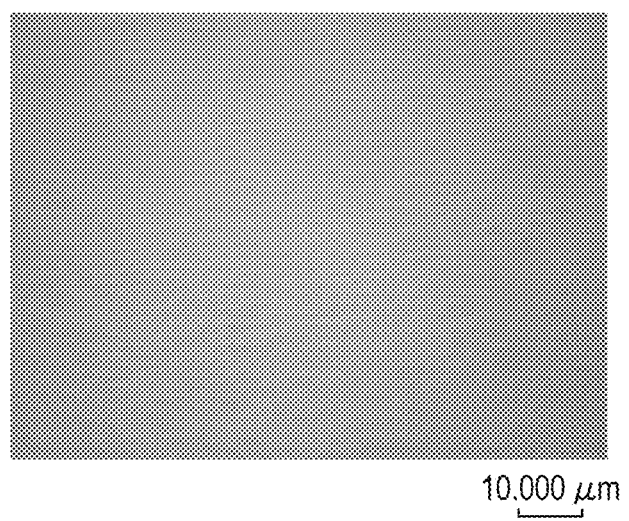
FIG. 19B illustrates the surface morphology of a nitride semiconductor layer prepared in Example 9.

FIG. 19B illustrates the surface morphology of the nitride semiconductor layer 300 after growth. For comparison, FIG. 19A illustrates the surface morphology of the nitride semiconductor layer 300 prepared in Example 4 above, where the inclination angle α was equal to that in Example 9. The surface flatness of the nitride semiconductor layer 300 was markedly improved by changing the growth conditions as shown in Table 3. The pattern of the {10-11} facet planes, which was observed in Example 4, was hardly observed. The surface roughness was reduced to 43 nm in Example 9, while the surface roughness was 482 nm in Example 4.

While the surface flatness of the nitride semiconductor layer 300 prepared in Example 9 was improved, the crystallinity of the nitride semiconductor layer 300 was not so high compared with the case where the inclination angle was set to 0 degrees. The FWHM of X-ray rocking curve measured by (11-22) diffraction in the X-ray incident direction 2 in Example 9 was 946 seconds, which was nearly double the FWHM measured in Example 4, where the inclination angle was equal to that in Example 9. The results again confirm that formation of the {10-11} facet planes leads to a reduction in dislocation density.

However, since the method described in Example 9, where the conditions described in Table 3 were employed, can be suitably used for improving surface flatness, the growth conditions described in Tables 1 and 3 may be used in combination. By performing crystal growth under the growth conditions described in Table 1 at the first stage and then performing crystal growth under the growth conditions described in Table 3 at the second stage, a semi-polar plane nitride semiconductor layer 300 having a low dislocation density and high surface flatness can be formed.

Thus, it is confirmed that, in the first embodiment, it is essential for reducing dislocation density only that the step of growing the {10-11} facet planes be included in the process for forming a nitride semiconductor layer, and that it is not always necessary that the {10-11} facet planes are present on the surface of the nitride semiconductor layer after growth.

Example 10

Reduction in Stacking Fault Density by Selective Growth (Inclination Angle α=10 Degrees)

The improvement of crystallinity by controlling the inclination angle α, which is described in Reference Examples 1 to 3 and Examples 4 to 8 above, was mainly achieved due to a reduction in dislocation density. However, in general, a reduction in the stacking fault density has also been a critical issue in crystal growth for semi-polar plane nitride semiconductors as well as a reduction in dislocation density. It is considered that stacking fault density was not reduced to a sufficient degree in Examples 4 to 7, while dislocation density was reduced.

It is known that a selective growth method may be employed in order to markedly reduce stacking fault density as well as dislocation density. Thus, the first embodiment may be implemented by using a selective growth method in order to reduce stacking fault density while controlling the inclination angle α.

In Example 10, a nitride semiconductor multilayer structure formed by selective growth in which the inclination angle α was set to 10 degrees is described.

Figure 20A:
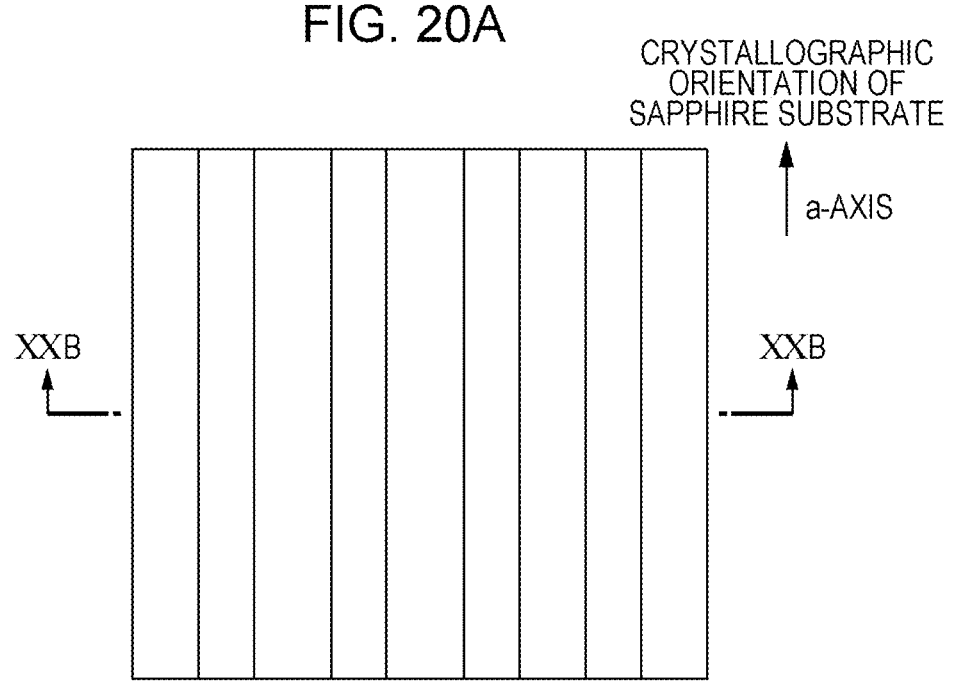
FIGS. 20A and 20B schematically illustrate a mask and a substrate that were used for performing selective growth in Example 10, which are viewed in a direction perpendicular to the surface of a sapphire substrate and in the a-axis direction of the sapphire substrate, respectively.
Figure 20B:
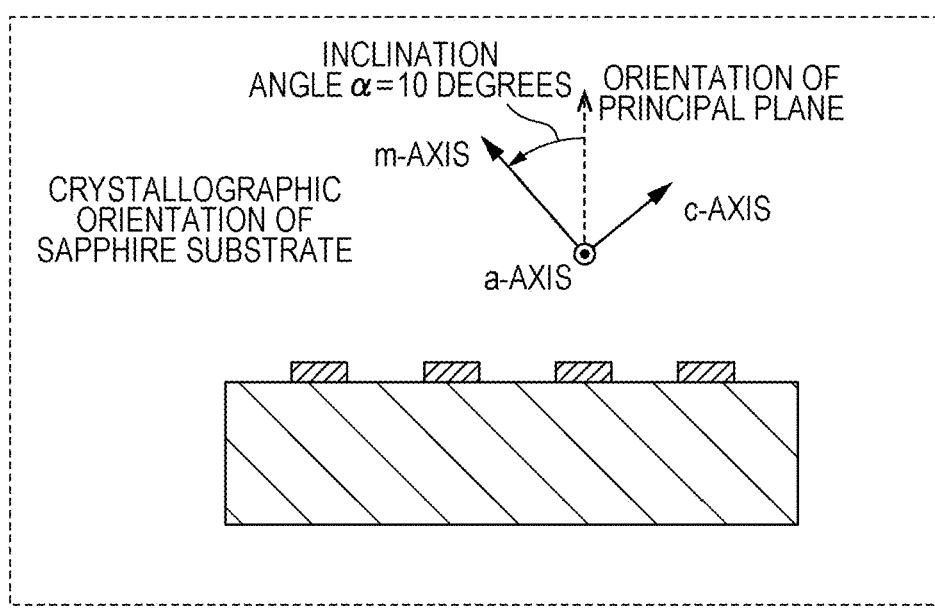

FIGS. 20A and 20B illustrate the structure of a sapphire substrate 100 used in Example 10 for selective growth.

In Example 10, a striped mask layer 130 was formed on the surface of a sapphire substrate 100. FIG. 20A is a plan view of the sapphire substrate 100, which is viewed in the direction of the orientation of the principal plane. The mask layer 130 having a striped pattern, that is, a linear pattern (hereinafter, referred to as "line portions"), and portions that were not covered with the mask layer 130, at which the surface of the sapphire substrate 100 was exposed (hereinafter, referred to as "space portions") were present on the surface of the sapphire substrate 100.

The line portions extended in a direction parallel to the m-axis [1-100] of the nitride semiconductor layer and the a-axis of the sapphire substrate. The mask layer was composed of a dielectric material and was a $SiO_2$ film in Example 10. However, it was also possible to perform selective growth using a mask layer composed of silicon nitride or an oxide film such as an $Al_2O_3$ film, a $TiO_2$ film, or an $HfO_2$ film. The thickness of the mask layer 130 was 100 nm. The mask layer 130 was deposited by sputtering.

The widths of the line portions and the space portions illustrated in FIG. 20A were set to 5 μm.

The widths of the line portions and the space portions may be selected appropriately, which increase or reduce dislocation density and stacking fault density. The widths of the line portions and the space portions may be controlled within the range of 100 nm or more and 30 μm or less. The width of the line portions may be different from the width of the space portions.

Figure 21:
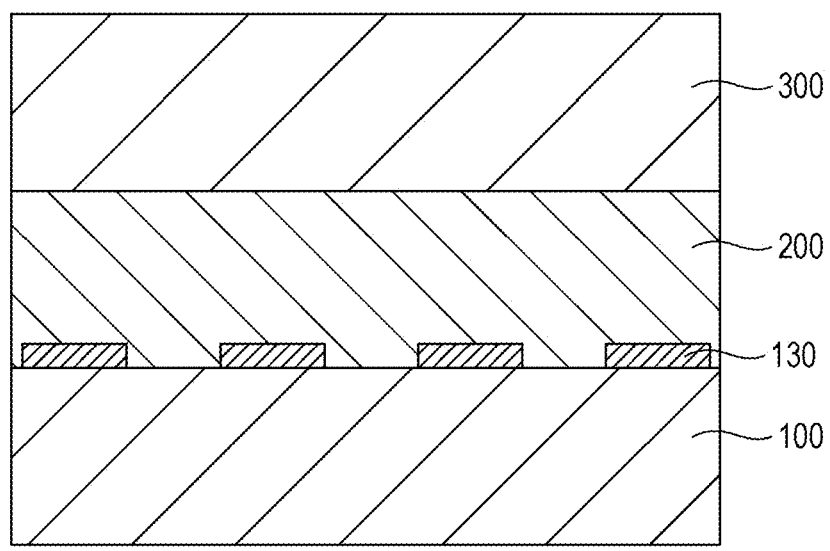
FIG. 21 is a schematic cross-sectional view of a nitride semiconductor multilayer structure prepared in Example 10.

FIG. 20B is a cross-sectional view of the mask layer 130 taken along the line XXB-XXB illustrated in FIG. 20A. FIG. 21 schematically illustrates the nitride semiconductor structure prepared in Example 10.

After the mask layer 130 was formed on the surface of the sapphire substrate 100, a buffer layer 200 composed of GaN and a nitride semiconductor layer 300 composed of GaN were successively grown on the sapphire substrate 100.

When the nitride semiconductor layer was grown on the substrate illustrated in FIGS. 20A and 20B, the nitride semiconductor layer was selectively grown only on the space portions, on which the mask was not present. As a result, dislocation density and stacking fault density were able to be reduced. The buffer layer 200 was formed under the growth conditions described in Table 3, except that only the growth time was changed to 1.5 hours. The nitride semiconductor layer 300 was formed under the growth conditions described in Table 1.

Figure 22A:
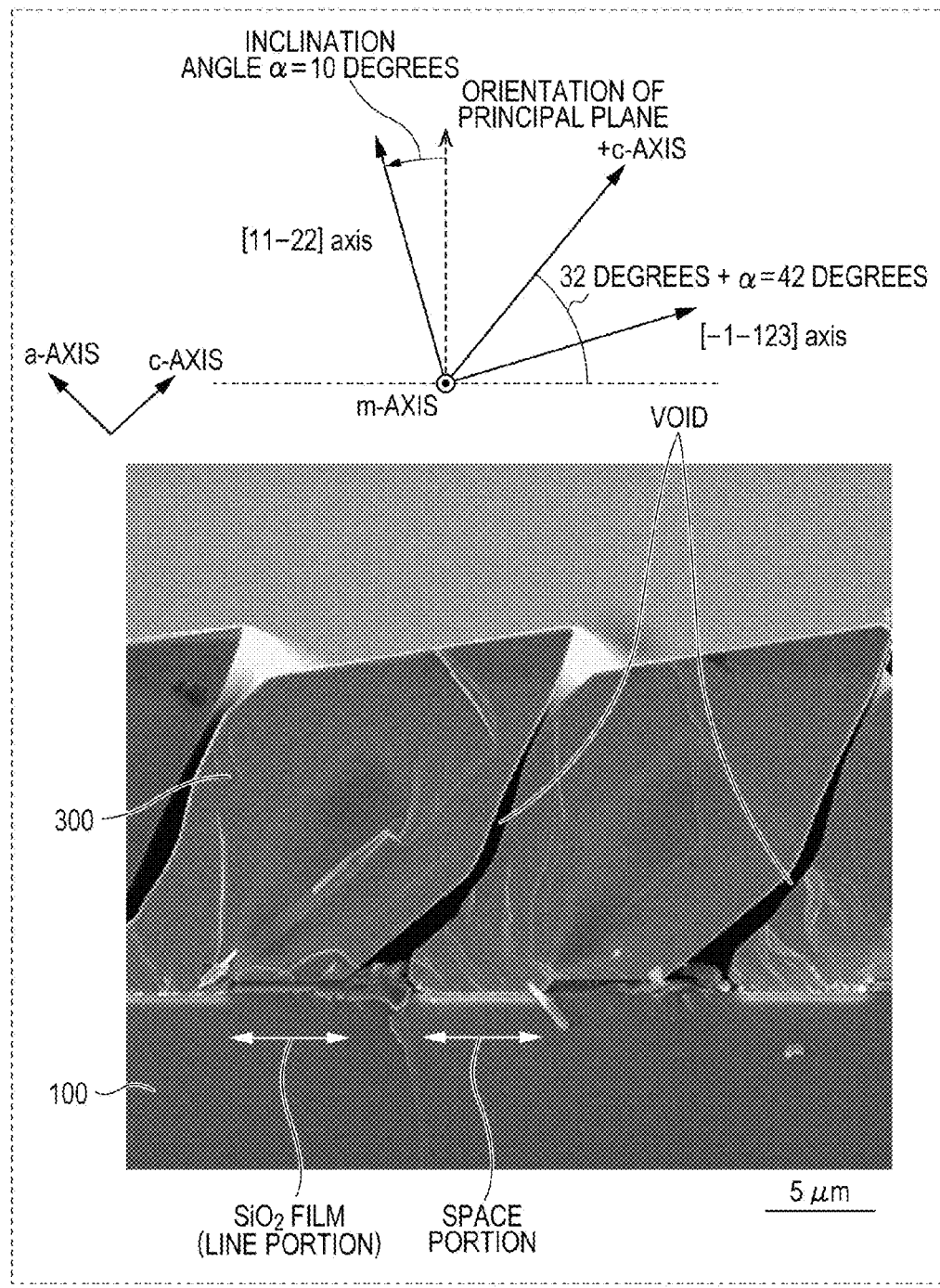
FIG. 22A is a cross-sectional SEM image of a nitride semiconductor structure prepared in Example 10.
Figure 22B:
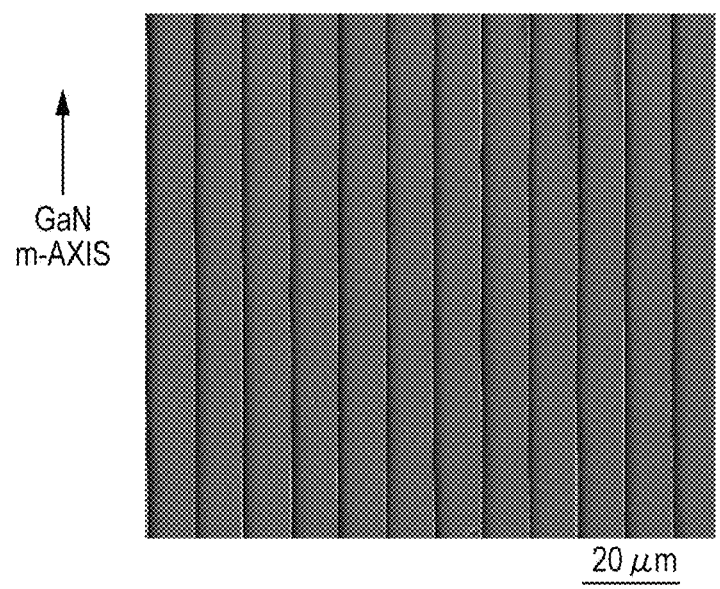
FIG. 22B is a surface SEM image of a nitride semiconductor structure prepared in Example 10.

FIGS. 22A and 22B are the cross-sectional SEM image and the surface SEM image of the nitride semiconductor structure after growth. It was confirmed from the cross-sectional SEM image that the nitride semiconductor layer was selectively grown on the space portions, on which the $SiO_2$ mask was absent. However, in the nitride semiconductor films that were selectively grown on the space portions, crystals were grown asymmetrically in the [-1-123] crystallographic direction of GaN. In addition, the crystals were grown so as to cover the $SiO_2$ mask.

In the nitride semiconductor structure prepared in Example 10, the nitride semiconductor films grown on the respective space portions were not completely combined with one another. However, this issue would be easily addressed by optimizing the growth conditions (e.g., by increasing the growth time).

In the surface SEM image illustrated in FIG. 22B, voids extending in the m-axis direction, which were formed between the nitride semiconductor films that were not combined with one another, were observed. The voids illustrated in FIG. 22A, which were formed during the selective growth, played an important role in reducing dislocation density and stacking fault density. It is known that stacking faults occur mainly on the c-plane during the growth of a semi-polar nitride semiconductor layer having a principal plane that is the (11-22) plane. In Example 10, high-density dislocations and stacking faults occurred in the vicinity of the selective-growth region interface located on the space portions. The stacking faults were mainly present in the c-plane and extended in the a-axis direction illustrated in FIG. 22A. Since the gaps were present in the a-axis direction in the cross-sectional SEM image illustrated in FIG. 22A, stacking faults that occurred in the vicinity of the interface located on the space portions were terminated at the voids. Thus, it was possible to reduce the density of the stacking faults by using a selective growth method. Furthermore, controlling the inclination angles also reduced the density of the dislocations.

Figure 23:
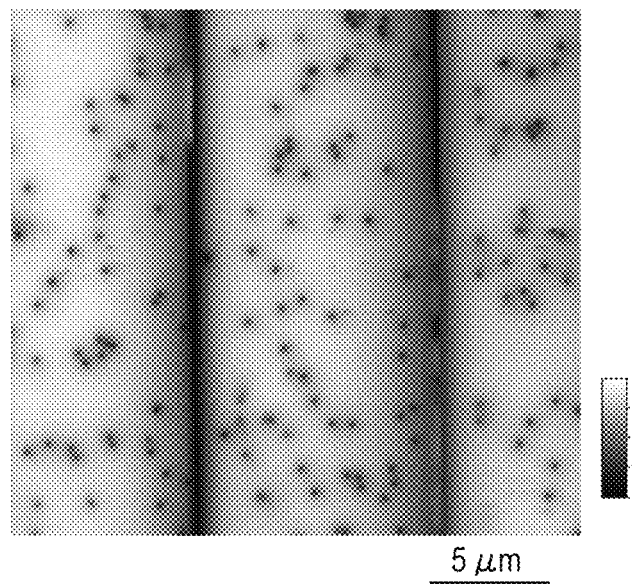
FIG. 23 is a surface CL image of a nitride semiconductor structure prepared in Example 10.

FIG. 23 is the CL image of the nitride semiconductor layer prepared in Example 10. The CL image was formed at room temperature under the same conditions as those under which the CL images illustrated in FIGS. 16A to 16F were formed. The dislocation density calculated from the number of dark spots was $2.7 \times 10^7$ $cm^{-2}$, which was one order of magnitude lower than that measured in Example 5. This confirms that the dislocation density in the nitride semiconductor layer prepared in Example 10 was reduced by using a selective growth method.

Table 4 summarizes the result of evaluation of the crystallinity of the nitride semiconductor layer prepared in Example 10.

TABLE 4

| Sample | Inclination angle α (deg) | (11-22) Diffraction half width: X-ray incident direction 2 (sec) | (0002) Diffraction half width (sec) | Dislocation density |
|---|---|---|---|---|
| Example 10 | 10 | 285 | 325 | $2.7 \times 10^7$ $cm^{-2}$ |

The FWHMs of X-ray rocking curves were about 300 seconds. Thus, it is confirmed that crystallinity may be markedly improved by employing a selective growth method in the first embodiment.

The results obtained in Example 10 confirm that density of dislocation in addition to stacking fault may be significantly reduced and crystal quality may be markedly improved by employing a selective growth method and controlling of the inclination angle α.

Second Embodiment

The nitride semiconductor structure according to the first embodiment may be used as a nitride semiconductor bulk substrate for producing electronic devices such as a light-emitting element and a power device.

Figure 24:
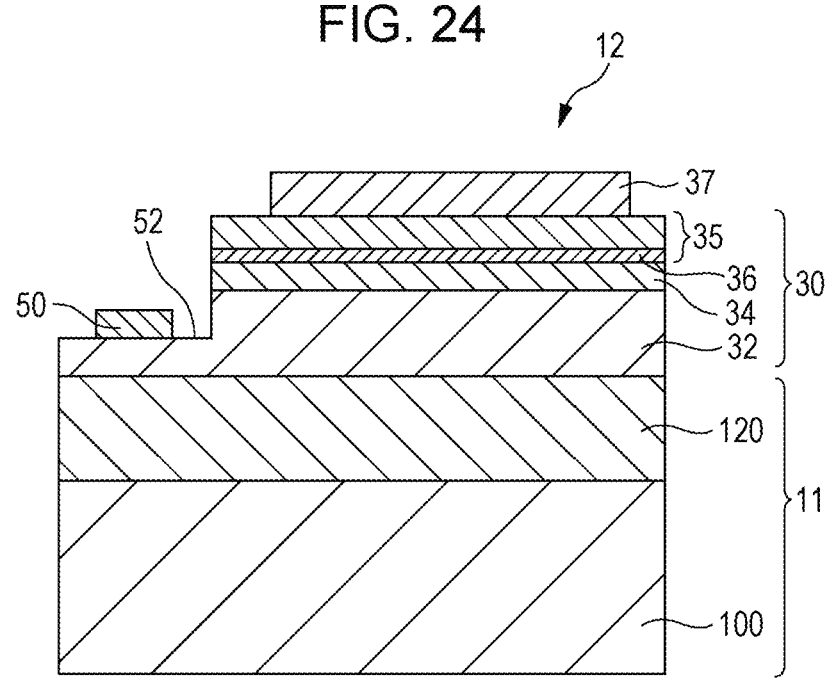
FIG. 24 is a schematic cross-sectional view of a light-emitting element according to an embodiment of the present disclosure.

FIG. 24 schematically illustrates a light-emitting element 12 according to the second embodiment. The light-emitting element 12 illustrated in FIG. 24 includes the nitride semiconductor structure 11 according to the first embodiment.

The light-emitting element 12 includes the nitride semiconductor structure 11 and a nitride semiconductor structure 30 disposed on the nitride semiconductor structure 11. The nitride semiconductor structure 30 includes an n-type nitride semiconductor layer 32, a p-type nitride semiconductor layer 35, and an active layer 34 located between the n-type nitride semiconductor layer 32 and the p-type nitride semiconductor layer 35. The p-type nitride semiconductor layer 35 may include an undoped nitride semiconductor layer 36 disposed on a surface thereof facing the active layer 34.

A recess 52 is formed in the nitride semiconductor structure 30, at which a portion of the n-type nitride semiconductor layer is exposed. An n-side electrode 50 is disposed on the bottom of the recess 52 so as to be in electrical contact with the n-type nitride semiconductor layer 32. The nitride semiconductor structure 30 further includes a p-side electrode 37 that is electrical contact with the p-type nitride semiconductor layer 35.

The nitride semiconductor structure 30 is composed of $Al_xGa_yIn_zN$ (where $0 \leq x, y, z \leq 1$ and $x+y+z=1$). Silicon (Si) may be used as an n-type dopant. Magnesium (Mg) may be used as a p-type dopant. The nitride semiconductor structure 30 may be formed by any epitaxial growth technique, similarly to the nitride semiconductor structure 11.

Each semiconductor layer constituting the nitride semiconductor structure 30 has a principal plane having the same orientation as that of a nitride semiconductor layer included in the nitride semiconductor structure 11. Thus, the light-emitting element according to the second embodiment includes an active layer 34 having a principal plane that is inclined at 5 degrees or more and 17 degrees or less and is desirably inclined at 5 degrees or more and 15 degrees or less with respect to the [11-22] axis of the nitride semiconductor in the +c-axis direction. The active layer 34 has a low dislocation density of $1 \times 10^8$ cm$^{-2}$ or less.

The normal to the principal plane of the nitride semiconductor layer 300 (illustrated in FIG. 3) included in the nitride semiconductor structure 11 or the normal to the principal plane of the nitride semiconductor multilayer structure 120 may be inclined at 10 degrees or more and 17 degrees or less and is desirably inclined at 10 degrees or more and 15 degrees or less with respect to the [11-22] axis of the nitride semiconductor to the +c-axis direction. In such a case, the normal to the principal plane of the active layer 34 included in the light-emitting element 12 is also inclined at 10 degrees or more and 17 degrees or less and is desirably inclined at 10 degrees or more and 15 degrees or less with respect to the [11-22] axis of the nitride semiconductor in the +c-axis direction, which reduces the internal electric field generated due to piezo polarization. Thus, the light-emitting element 12 is capable of addressing the issue caused due to piezo polarization and achieves a good luminescence property.

Third Embodiment

A light-emitting element 12 according to the second embodiment can be used alone as a light source. However, when used in combination with a resin or the like including a fluorescent material for wavelength conversion, the light-emitting element according to the second embodiment can be used as a light source that covers a wide wavelength range.

Figure 25:
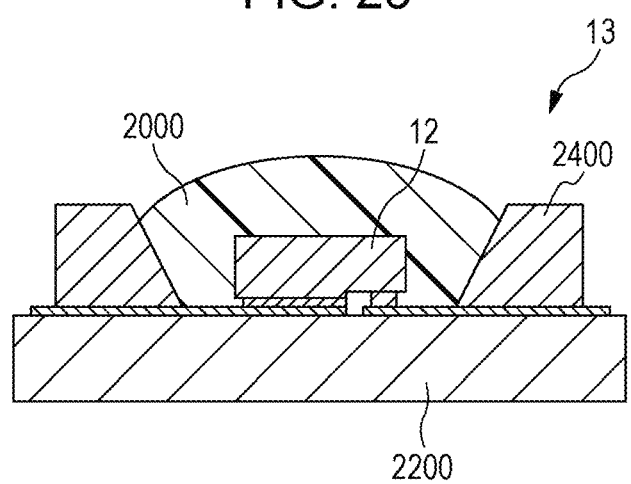
FIG. 25 is a schematic cross-sectional view of a light source according to an embodiment of the present disclosure.

FIG. 25 schematically illustrates an example of a light source 13 according to the third embodiment. The light source 13 illustrated in FIG. 25 includes the light-emitting element 12 according to the second embodiment and a resin layer 2000, in which a fluorescent material is dispersed. The fluorescent material enables the wavelength of light emitted by the light-emitting element 12 to be converted into another wavelength range. The light-emitting element 12 is disposed on a support 2200, on which a wiring pattern is formed. A reflector 2400 is disposed on the support 2200 so as to surround the light-emitting element 12. The resin layer 2000 is disposed so as to cover the light-emitting element 12.

The above-described semi-polar plane nitride semiconductor structure can be used as a base structure for producing nitride semiconductor optical devices (e.g., LEDs, light-receiving devices, and solar cells), nitride semiconductor lasers, and nitride semiconductor electronic devices (e.g., transistors and power devices). The nitride semiconductor structure may also be used as a base structure for producing nitride semiconductor bulk crystals.

What is claimed is:

1. A nitride semiconductor structure comprising a nitride semiconductor layer having a principal plane and including a nitride semiconductor,
    wherein a normal to the principal plane of the nitride semiconductor layer is inclined at 5 degrees or more and 17 degrees or less with respect to a [11-22] axis of the nitride semiconductor constituting the nitride semiconductor layer in the direction of a +c-axis of the nitride semiconductor.

2. The nitride semiconductor structure according to claim 1, further comprising a substrate having a principal plane, the substrate supporting the nitride semiconductor layer on the principal plane,
    wherein the substrate includes any one selected from the group consisting of a nitride semiconductor, sapphire, and silicon.

3. The nitride semiconductor structure according to claim 2,
    wherein the substrate is a sapphire substrate including the sapphire, and
    wherein a normal to the principal plane of the substrate is inclined at 5 degrees or more and 17 degrees or less with respect to an m-axis of the sapphire in the direction of a c-axis of the sapphire.

4. The nitride semiconductor structure according to claim 3, further comprising a buffer layer between the nitride semiconductor layer and the substrate,
    wherein the buffer layer includes a nitride semiconductor that does not include aluminum.

5. The nitride semiconductor structure according to claim 2,
    wherein the substrate includes the nitride semiconductor, and
    wherein a normal to the principal plane of the substrate is inclined at 5 degrees or more and 17 degrees or less with respect to a [11-22] axis of the nitride semiconductor constituting the substrate in the direction of a +c-axis of the nitride semiconductor constituting the substrate.

6. The nitride semiconductor structure according to claim 2,
    wherein the substrate includes the silicon, and
    wherein a normal to the principal plane of the substrate is inclined at 41 degrees or more and 53 degrees or less with respect to a (111) plane of the silicon in the direction of a [1-10] axis of the silicon.

7. The nitride semiconductor structure according to claim 1,
    wherein the nitride semiconductor layer has a dislocation density of $1 \times 10^8$ cm$^{-2}$ or less as measured by transmission electron microscopy.

8. The nitride semiconductor structure according to claim 1,
wherein the normal to the principal plane of the nitride semiconductor layer is inclined at 10 degrees or more and 17 degrees or less with respect to a normal to a (11-22) plane of the nitride semiconductor constituting the nitride semiconductor layer in the direction of the +c-axis of the nitride semiconductor.

9. The nitride semiconductor structure according to claim 1,
wherein the normal to the principal plane of the nitride semiconductor layer is inclined at 5 degrees or more and 15 degrees or less with respect to the [11-22] axis of the nitride semiconductor constituting the nitride semiconductor layer in the direction of the +c-axis of the nitride semiconductor.

10. The nitride semiconductor structure according to claim 2,
wherein the substrate is a sapphire substrate including sapphire, and
wherein a normal to the principal plane of the substrate is inclined at 5 degrees or more and 15 degrees or less with respect to an m-axis of the sapphire in the direction of a c-axis of the sapphire.

11. The nitride semiconductor structure according to claim 2,
wherein the substrate includes a nitride semiconductor, and
wherein a normal to the principal plane of the substrate is inclined at 5 degrees or more and 15 degrees or less with respect to a [11-22] axis of the nitride semiconductor constituting the substrate in the direction of a +c-axis of the nitride semiconductor constituting the substrate.

12. The nitride semiconductor structure according to claim 2,
wherein the substrate includes silicon, and
wherein a normal to the principal plane of the substrate is inclined at 43 degrees or more and 53 degrees or less with respect to a (111) plane of the silicon in the direction of a [1-10] axis of the silicon.

13. The nitride semiconductor structure according to claim 1,
wherein the normal to the principal plane of the nitride semiconductor layer is inclined at 10 degrees or more and 15 degrees or less with respect to a normal to a (11-22) plane of the nitride semiconductor constituting the nitride semiconductor layer in the direction of the +c-axis of the nitride semiconductor.

14. An electronic device comprising multiple layers of nitride semiconductor,
wherein one of the multiple layers is the nitride semiconductor structure according to claim 1.

15. A light-emitting device comprising:
a nitride semiconductor structure comprising a nitride semiconductor layer having a principal plane and including a nitride semiconductor;
a nitride semiconductor multilayer structure disposed on the nitride semiconductor structure, the nitride semiconductor multilayer structure including
an n-type nitride semiconductor layer,
a p-type nitride semiconductor layer, and
an active layer between the n-type nitride semiconductor layer and the p-type nitride semiconductor layer;
an n-side electrode being in electrical contact with the n-type nitride semiconductor layer; and
a p-side electrode being in electrical contact with the p-type nitride semiconductor layer, wherein
a normal to the principal plane of the nitride semiconductor layer is inclined at 5 degrees or more and 17 degrees or less with respect to a [11-22] axis of the nitride semiconductor constituting the nitride semiconductor layer in the direction of a +c-axis of the nitride semiconductor.

* * * * *